US012557651B2

(12) United States Patent
Ueda et al.

(10) Patent No.: US 12,557,651 B2
(45) Date of Patent: Feb. 17, 2026

(54) LOW-TEMPERATURE DEPOSITION OF HIGH-QUALITY ALUMINUM NITRIDE FILMS FOR HEAT SPREADING APPLICATIONS

(71) Applicants: The Regents of the University of California, Oakland, CA (US); The Board of Trustees of the Leland Stanford Junior University, Stanford, CA (US); Raytheon Company, Waltham, MA (US)

(72) Inventors: Scott Ueda, Whittier, CA (US); Aaron McLeod, La Jolla, CA (US); Andrew Kummel, San Diego, CA (US); Mike Burkland, Tucson, AZ (US); Eduardo M. Chumbes, Andover, MA (US); Thomas E. Kazior, Arlington, VA (US); Eric Pop, Stanford, CA (US); Michelle Chen, Stanford, CA (US); Chris Perez, Stanford, CA (US); Mark Rodwell, Santa Barbara, CA (US)

(73) Assignees: The Regents of the University of California, Oakland, CA (US); The Board of Trustees of the Leland Stanford Junior University, Stanford, CA (US); Raytheon Company, Waltham, MA (US)

( * ) Notice: Subject to any disclaimer, the term of this patent is extended or adjusted under 35 U.S.C. 154(b) by 732 days.

(21) Appl. No.: 17/169,914

(22) Filed: Feb. 8, 2021

(65) Prior Publication Data
US 2021/0249331 A1  Aug. 12, 2021

Related U.S. Application Data

(60) Provisional application No. 63/089,127, filed on Oct. 8, 2020, provisional application No. 62/971,346, filed on Feb. 7, 2020.

(51) Int. Cl.
*C23C 16/34* (2006.01)
*C23C 16/30* (2006.01)
(Continued)

(52) U.S. Cl.
CPC ........ *H01L 23/3731* (2013.01); *C23C 16/303* (2013.01); *C23C 16/4554* (2013.01);
(Continued)

(58) Field of Classification Search
None
See application file for complete search history.

(56) References Cited

FOREIGN PATENT DOCUMENTS

| EP | 2866316 A1 * | 4/2015 | ............. H01S 5/021 |
| JP | H09115917 A * | 5/1997 | ........... B23K 26/034 |

(Continued)

OTHER PUBLICATIONS

Seppänen et al. Aluminum Nitride Transition Layer for Power Electronics Applications Grown by Plasma-Enhanced Atomic Layer Deposition. Materials 2019, 12, 406.*
(Continued)

*Primary Examiner* — David P Turocy
(74) *Attorney, Agent, or Firm* — Stanek Lemon Crouse & Meeks, PA

(57) ABSTRACT

Provided are high quality metal-nitride, such as aluminum nitride (AlN), films for heat dissipation and heat spreading applications, methods of preparing the same, and deposition of high thermal conductivity heat spreading layers for use in RF devices such as power amplifiers, high electron mobility transistors, etc. Aspects of the inventive concept can be used to enable heterogeneously integrated compound semiconductor on silicon devices or can be used in in non-RF applications as the power densities of these highly scaled microelectronic devices continues to increase.

16 Claims, 29 Drawing Sheets

(51) Int. Cl.
| | |
|---|---|
| C23C 16/455 | (2006.01) |
| H01L 21/02 | (2006.01) |
| H01L 21/48 | (2006.01) |
| H01L 23/373 | (2006.01) |

(52) U.S. Cl.
CPC .... *H01L 21/02172* (2013.01); *H01L 21/0228* (2013.01); *H01L 21/02315* (2013.01); *H01L 21/02458* (2013.01); *H01L 21/4807* (2013.01)

(56) References Cited

FOREIGN PATENT DOCUMENTS

| | | | | |
|---|---|---|---|---|
| WO | WO-2015002782 A1 | * | 1/2015 | ........... B23K 26/034 |
| WO | WO-2015042199 A1 | * | 3/2015 | ........... B23K 26/034 |

OTHER PUBLICATIONS

Tonisch et al. Piezoelectric properties of polycrystalline AlN thin films for MEMS application. Sensors and Actuators A 132 (2006) 658-663.*

Buttera et al. Tris(dimethylamido)aluminum(III): An overlooked atomic layer deposition precursor. J. Vac. Sci. Technol. A 35, 01B128 (2017).*

Tuning Material Properties of Oxides and Nitrides by Substrate Biasing during Plasma-Enhanced Atomic Layer Deposition on Planar and 3D Substrate Topographies. ACS Appl. Mater. Interfaces 2018, 10, 13158-13180.*

Legallais et al. Improvement of AlN Film Quality Using Plasma Enhanced Atomic Layer Deposition with Substrate Biasing. ACS Appl. Mater. Interfaces 2020, 12, 39870-39880.*

Mizuta et al., "Low Temperature Growth of GaN and AlN on GaAs Utilizing Metalorganics and Hydrazine," Japanese Journal of Applied Physics, vol. 25, No. 12, Dec. 1986, pp. L945-L948.

Gordon et al. "Chemical vapor deposition of aluminum nitride thin films," J. Matr. Res., vol. 7, No. 7, Jul. 1992, pp. 1679-1684.

Liu et al., "Atomic Layer Deposition of AlN with Tris(Dimethylamido) aluminum and NH3," ECS Transactions, 41 (2) 219-225, 2011.

Abdulagatov et al. "Atomic Layer Deposition of Aluminum Nitride Using Tris(Diethylamido)aluminum and Hydrazine or Ammonia," Russian Microelectronics, 2018, vol. 47, No. 2, pp. 118-130.

Shih et al., "Low-temperature atomic layer epitaxy of AlN ultrathin films by layer-by-layer, in-situ atomic layer annealing," Scientific Reports, 7, 39717, 2017, 8 pages.

Profijt et al., "Substrate-biasing during plasma-assisted atomic layer deposition to tailor metal-oxide thin film growth," J. Vac. Sci. Technol. A 31(1), Jan./Feb. 2013, pp. 01A106-1 to 01A106-9.

Lifshitz et al., "Subplantation model for film growth from hyperthermal species," Physical Review B, , vol. 41, No. 15, May 15, 1990, pp. 10 468 to 10 480.

Takagi, T., "Ion-surface interactions during thin film deposition," J. Vac. Sci. Technol. A 2(2), Apr.-Jun. 1984, pp. 382-388.

Williams et al., "Structural properties of titanium dioxide films deposited in an rf glow discharge," J. Vac. Sci. Technol. A 1 (4), Oct.-Dec. 1983, pp. 1810-1819.

Xu et al., "Thermal conductivity of crystalline AlN and the influence of atomic-scale defects," J. Appl. Phys. 126, 2019, pp. 185105-1 to 185150-7.

Kao et al., "AlN epitaxy on SiC by low-temperature atomic layer deposition via layer-by-layer, in situ atomic layer annealing," RSC Adv, 9, 2019, pp. 12226-12231.

Ho et al., "Thermal Conductivity of the Elements," J. Phys. Chem. Ref. Data, vol. 1, No. 2, 1972, pp. 281-421 pages.

Sichel et al., "Heat capacity and thermal conductivity of hexagonal pyrolytic boron nitride," Physical Review B, vol. 13, No. 10, May 15, 1976, 7 pages.

Rounds et al., "The influence of point defects on the thermal conductivity of AlN crystals," Journal of Applied Physics, 123, 2018, pp. 185107-1 to 185107-7.

Heo et al., "Enhanced heat transfer by room temperature deposition of AlN film on aluminum for a light emitting diode package," Applied Thermal Engineering, 50, 2013, pp. 799-804.

La Spina et al., "Aluminum nitride for heatspreading in RF IC's, "Solid-State Electronics, 52, 2008, pp. 1359-1363.

Lu et al., "Effect of an AlN buffer layer on the epitaxial grown of InN by molecular-beam epitaxy," Applied Physics Letters, vol. 79, No. 10, Sep. 3, 2001, pp. 1489-1491.

Ponce et al., "Crystalline structure of AlGaN epitaxy on sapphire using AlN buffer layers," Appl. Phys. Lett. 65 (18), Oct. 31, 1994, pp. 2302-2304.

Amano et al., "Effects of the Buffer Layer in Metalorganic Vapour Phase Epitaxy of GaN on Sapphire Substrate," Thin Solid Films, 163, 1988, pp. 415-420.

Kuznia et al., "Influence of buffer layers on the deposition of high quality single crystal GaN over sapphire substrates," J. Appl. Phys. 73 (9), May 1, 1993, pp. 4700-4702.

Shiino et al., "Improvement of Critical Temperature of Superconducting NbN and NbTiN Thin Films Using an AlN Buffer Layer," The University of Tokyo, Jun. 18, 2009, 1 page.

Chen et al., "Influence of the growth temperature of AlN nucleation layer on AlN template grown by high-temperature MOCVD," Materials Letters 114, 2014, pp. 26-28.

Kakanakova-Gueorguie et al., "High-quality AlN layers grown by hot-wall MOCVD at reduced temperatures," Journal of Crystal Growth, 338, 1, 2012, pp. 52-56.

Van Bui et al., "Initial growth, refractive index, and crystallinity of thermal and plasma- enhanced atomic layer deposition AlN films," J. Vac. Sci. Technol. A 33 (1), Jan./Feb. 2015, pp. 01A111-1 to 01A111-6.

Sippola et al., "Comparison of mechanical properties and composition of magnetron sputter and plasma enhanced atomic layer deposition aluminum nitride films," J. Vac. Sci. Technol. A 36 (5), Sep./Oct. 2018, pp. 051508-1 to 051508-11.

Banerjee et al., "PEALD AlN: Controlling growth and film crystallinity," Phys. Status Solidi C 12, No. 7, 2015, pp. 1036-1042.

Alevli et al., "Structural properties of AlN films deposited by plasma-enhanced atomic layer deposition at different growth temperatures," Phys. Status Solidi A 209, No. 2, 2012, pp. 266-271.

Tarala et al., "Growing Oriented AlN Films on Sapphire Substrates by Plasma-Enhanced Atomic Layer Deposition," Technical Physics Letters, vol. 43, No. 1, 2017, pp. 29-32.

Motamedi et al., "Structural and optical characterization of low-temperature ALD crystalline AlN," Journal of Crystal Growth 421, 2015, pp. 45-52.

Bosund et al., "Properties of AlN grown by plasma enhanced atomic layer deposition," Applied Surface Science, 257, 2011, pp. 7827-7830.

Liu et al., "PEALD-Grown Crystalline AlN Films on Si (100) with Sharp Interface and Good Uniformity," Nanoscale Research Letters, 2017, 12:279, 6 pages.

Wang et al., "Crystal phase transition of HfO$_2$ films evaporated by plasma-ion-assisted deposition," Applied Optics, vol. 47, No. 13, May 1, 2008, pp. C189-C192.

Park et al., Plasma-Enhanced Atomic Layer Deposition of TaN Thin Films Using Tantalum-Pentafluoride and N$_2$/H$_2$/Ar Plasma, Journal of the Electrochemical Society, 153 (11), 2006, pp. C751-C754.

Profijt et al., "Substrate Biasing during Plasma-Assisted ALD for Crystalline Phase-Control of TiO$_2$ Thin Films," Electrochemical and Solid-State Letters, 15 (2), 2012, pp. G1-G3.

Faraz et al., "Tuning Material Properties of Oxides and Nitrides by Substrate Biasing during Plasma-Enhanced Atomic Layer Deposition on Planar and 3D Substrate Topographies, "ACS Appl. Mater. Interfaces, 10, 2018, pp. 13158-13180.

Jung et al., "Low Temperature Thermal Atomic Layer Deposition of Aluminum Nitride Using Hydrazine as the Nitrogen Source," Materials, 13, 3387, 2020, 10 pages.

Gordon et al., "Chemical Vapor Deposition and Properties of Amorphous Aluminum Oxide Films," Mater. Res. Soc. Symp. Proc., 446, 383, 1997, 6 pages.

Lee et al., "Nanoscale GaN Epilayer Grown by Atomic Layer Annealing and Epitaxy at Low Temperature," ACS Sustainable Chem. Eng., 7, 2019, pp. 487-495.

(56) References Cited

OTHER PUBLICATIONS

Squire et al., "Mechanistic studies of the decomposition of trimethylaluminum on heated surfaces," J., Vac. Sci. Technol. B 3 (5), Sep./Oct. 1985, pp. 1513-1519.
Gow et al., "Decomposition of Trimethylaluminum on Si(100)," Chemistry of Materials, vol. 1, No. 4, 1989, pp. 406-411.
Abdulgatov et al., "Atomic Layer Deposition of Aluminum Nitride and Oxynitride on Silicon Using Tris(dimethylamido) aluminum, Ammonia, and Water," Russian Journal of General Chemistry, vol. 88, No. 8, 2018, pp. 1699-1706.
Buttera et al., "Tris(diemthylamido)aluminum(III): An overlooked atomic layer deposition precursor," J. Vac. Sci. Technol. A 35(1), Jan./Feb. 2017, pp. 01B128-1 to 01B128-7.
Scherrer, P., Bestimmung Der Größe Und Der Inneren Struktur von Kolloidteilchen Mittels Röntgenstrahlen. *Nachrichten von der Gesellschaft der Wissenschaften zu Göttingen, Math. Klasse*, 1918, pp. 98-100.
Kusaka et al., "Effect of sputtering gas pressure and nitrogen concentration on crystal orientation and residual stress in sputtered AlN films," Vacuum, 66, 2002, pp. 441-446.
Reinke et al., "Influence of the ion energy on the growth and structure of thin hydrocarbon films," J. Appl. Phys. 74 (2), Jul. 15, 1993, pp. 1354-1361.

\* cited by examiner

LOW-TEMPERATURE DEPOSITION OF HIGH-QUALITY ALUMINUM NITRIDE FILMS FOR HEAT SPREADING APPLICATIONS

CROSS-REFERENCE TO RELATED APPLICATIONS

This application claims the benefit of U.S. Provisional Application Ser. No. 62/971,346, filed Feb. 7, 2020, and U.S. Provisional Application Ser. No. 63/089,127, Oct. 8, 2020, the entireties of each of which is incorporated herein by reference.

STATEMENT OF GOVERNMENT SUPPORT

This invention was made with government support under Grant No. HR0011-18-3-0004 awarded by the Department of Defense/Defense Advanced Research Projects Agency (DARPA). The government has certain rights in the invention.

BACKGROUND

As transistor size decrease and current densities increase, it becomes a significant challenge to remove the heat generated during the operation of microelectronic circuits. Though many metals (e.g., copper) are highly thermally conductive, the use of conductive heat spreaders complicates 3D integration in VLSI CMOS or stack memory devices and induces parasitic losses in RF MMICs. Diamond, hexagonal boron nitride (h-BN), and aluminum nitride (AlN) are the three among the three most promising materials with both a high bandgap and high thermal conductivity [10]; however, out-of-plane heat transport for h-BN is poor, which limits its potential applications that necessitate vertical heat transport, and diamond needs to be grown at temperatures in excess of 500° C. which prevents integration into the back end of line (BEOL) applications.

Though chemical vapor deposited (CVD) films of AlN have been reported using TMA and hydrazine at ~225° C., the films are completely amorphous [1]. Amorphous films always have very low thermal conductivity. Polycrystalline AlN has been reported in purely thermal processes (i.e.: TDMAA/TDEAA+$NH_3$ or $N_2H_4$), but the grain size is usually low and/or a mixture of crystalline/amorphous phases [2-4]. Large grain sizes are considered key to high thermal conductivity for a given material. Shih et al. has reported using a pulsed argon plasma following every ALD cycle as a method to induce crystallinity at low temperatures (technique was called atomic layer annealing (ALA)), but the ion energy was not tuned and relied instead on the RF self-bias [5]. Separately, Profijt et al., reported using a RF stage bias to tailor film properties during traditional plasma enhanced ALD (PEALD) [6]. Using the stage biasing, incoming ion energy during PEALD can be tuned to improve nucleation, tailor the stress in the film, and enhance adatom migration the latter of which can be harnessed to improve the crystallinity of deposited amorphous/polycrystalline films [7-9]. As compared to conventional PEALD where the plasma is usually either (a) a reactive species that reacts with the first precursor to form a film or (b) drives forward the reactions between first and second precursor, the method described in this disclosure does not rely on the plasma for the formation of the film and the use of both pulsed plasma and pulsed biasing allows for ion energy control and the maintenance of charge neutrality.

It has been reported using the ALA technique to grow both crystalline AlN [5,12] and GaN [11] at relatively low growth temperatures (300° C.). Most notably, they reported a strong correlation between crystalline quality (i.e., average crystallite size) and the gas composition as a fraction of Ar:He. As He has a much smaller atomic mass than Ar, one potential effect of mixing He is to reduce either the momentum of the ions of a given energy, but gas ratios provide an overall poor control of the incoming ion energy. In addition, Xu et al. have compiled a list of the highest thermal conductivity AlN thin films deposited through various means including sputtering and MOCVD [10]. Nonetheless, there still remains a need for development of improved methods of preparing and fabricating films and/or layers for use in microelectronic devices for such functions as heat dissipation.

REFERENCES

[1] *Jpn. J. Appl. Phys.* 25, L945 (1986).
[2] *J. Mater. Res.* 7 (7), (1992).
[3] *ECS Trans.* 41 (2), 219-225 (2011).
[4] *Russian Microelectronics* 47 (2), 118-130 (2018).
[5] *Scientific Reports* 7, 39717 (2017).
[6] *J. Vac. Sci. Technol. A* 31 (1), (2013).
[7] *Phys. Rev. B* 41, 10468 (1990).
[8] *J. Vac. Sci. Technol. A* 2, 382 (1984).
[9] *J. Vac. Sci. Technol. A* 1, 1810 (1983).
[10] *J. Appl. Phys.* 126, 185105 (2019)
[11] *ACS Sustainable Chem. Eng.* 7, 1, 487-495 (2019).
[12] *RSC Adv.* 9, 12226-12231 (2019).

SUMMARY

This present inventive concept is related to a method for the low temperature (<400° C.) formation of high-quality, stress-controlled AlN films for the dissipation of heat, especially in microelectronic circuits as well as two structures that aid in that goal. AlN has the advantage of being both a good conductor of heat as well as an electrical insulator and as such it is of great interest for use as a heat spreading material in RF circuits as well in 3D heterogeneous integration (packaging) of logic and/or memory devices. Using either trimethyl aluminum (TMA) and hydrazine ($N_2H_4$) or tris(dimethylamido)aluminum (TDMAA) (or related compounds such as tris(diethylamido)aluminum) and $N_2H_4$ with a pulsed argon plasma treatment where the ion energy is precisely controlled, high-quality AlN films are deposited with large grain size and low oxygen/carbon contamination and can be used as a templating layer for further film growth. As heat spreading layers often need to be in excess of 1 μm thick, this further film growth can either be though thermal chemical vapor deposition (CVD) of TDMAA and $N_2H_4$ at >350° C., or through sputter deposition, both of which are known to yield polycrystalline films.

Accordingly, in an aspect of the inventive concept, provided is a method of forming a polycrystalline film on a substrate including at least one cycle of: exposing a surface of the substrate to an organometallic chemical precursor; exposing the organometallic chemical precursor to a nitrogen-containing co-reactant to provide a metal-nitride layer on the substrate; and treating the metal-nitride layer with an inert gas plasma to provide a polycrystalline metal-nitride template layer on the substrate, the at least one cycle, or cycles, followed by: depositing a second polycrystalline metal-nitride layer on the polycrystalline metal-nitride template layer to provide the polycrystalline film on the substrate.

In another aspect off the inventive concept, provided is a method of forming a heat dissipating film on a substrate including at least one cycle of: exposing a surface of the substrate to a TDMAA precursor; exposing the TDMAA precursor to an $N_2H_4$ co-reactant to provide an AlN layer on the substrate; and treating the AlN layer with an Ar plasma to provide a polycrystalline AlN template layer on the substrate, the at least one cycle, or cycles, followed by: depositing a second polycrystalline AlN layer on the polycrystalline AlN template layer to provide the heat dissipating film on the substrate.

In another aspect of the inventive concept, provided are heat dissipating/heat spreading films/layers including a polycrystalline metal-nitride template layer on a substrate; and a second polycrystalline metal-nitride layer on the polycrystalline metal-nitride template layer, wherein: the polycrystalline metal-nitride template layer has a thickness of about 10 nm to about 25 nm; the second polycrystalline metal-nitride layer has a thickness of about 100 nm to about 500 nm; and the heat dissipating film has a thermal conductivity of greater than or equal to about 70 $Wm^{-1}K^{-1}$.

Other aspects of the inventive concept include polycrystalline films/layers and/or heat dissipating/heat spreading films layers prepared by methods of the inventive concept, and semiconductor devices including polycrystalline films/layers and/or heat dissipating/heat spreading films/layers prepared by methods of the inventive concept.

DETAILED DESCRIPTION

Figure 1:
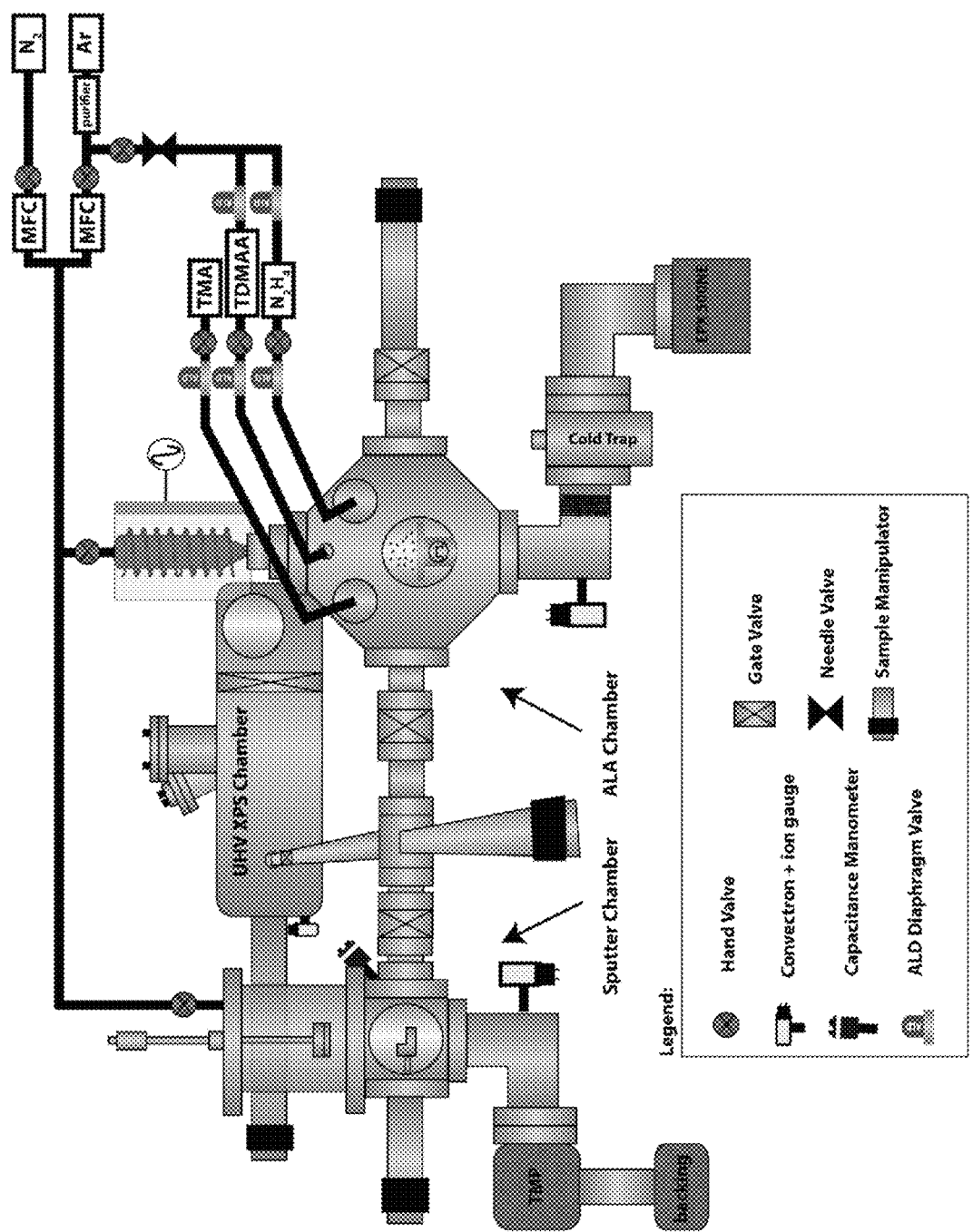
FIG. 1. Schematic of a custom vacuum chamber/tool used for performing methods according to the present inventive concept. Deposition was carried out in the custom-built ALA and sputter system load locked into a commercial UHV tool equipped with a XPS system.

The foregoing and other aspects of the present invention will now be described in more detail with respect to other embodiments described herein. It should be appreciated that the invention can be embodied in different forms and should not be construed as limited to the embodiments set forth herein. Rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Additionally, as used herein, the term "and/or" includes any and all combinations of one or more of the associated listed items and may be abbreviated as "/".

The term "comprise," as used herein, in addition to its regular meaning, may also include, and, in some embodiments, may specifically refer to the expressions "consist essentially of" and/or "consist of." Thus, the expression "comprise" can also refer to, in some embodiments, the specifically listed elements of that which is claimed and does not include further elements, as well as embodiments in which the specifically listed elements of that which is claimed may and/or does encompass further elements, or embodiments in which the specifically listed elements of that which is claimed may encompass further elements that do not materially affect the basic and novel characteristic(s) of that which is claimed. For example, that which is claimed, such as a composition, formulation, method, system, etc. "comprising" listed elements also encompasses, for example, a composition, formulation, method, kit, etc. "consisting of," i.e., wherein that which is claimed does not include further elements, and a composition, formulation, method, kit, etc. "consisting essentially of," i.e., wherein that which is claimed may include further elements that do not materially affect the basic and novel characteristic(s) of that which is claimed.

The term "about" generally refers to a range of numeric values that one of skill in the art would consider equivalent to the recited numeric value or having the same function or result. For example, "about" may refer to a range that is within ±1%, ±2%, ±5%, ±10%, ±15%, or even±20% of the indicated value, depending upon the numeric values that one of skill in the art would consider equivalent to the recited numeric value or having the same function or result. Furthermore, in some embodiments, a numeric value modified by the term "about" may also include a numeric value that is "exactly" the recited numeric value. In addition, any numeric value presented without modification will be appreciated to include numeric values "about" the recited numeric value, as well as include "exactly" the recited numeric value. Similarly, the term "substantially" means largely, but not wholly, the same form, manner or degree and the particular element will have a range of configurations as a person of ordinary skill in the art would consider as having the same function or result. When a particular element is expressed as an approximation by use of the term "substantially," it will be understood that the particular element forms another embodiment.

Unless otherwise defined, all technical and scientific terms used herein have the same meaning as commonly understood by one of ordinary skill in the art to which this invention belongs.

Embodiments of the present inventive concept relate to preparation of high thermal conductivity films, for example, high conductivity heat spreader films. Embodiments of the present inventive concept include low-temperature (<400° C.) deposition of polycrystalline metal nitride films, such as, but not limited to, aluminum nitride (AlN) films for use in, for example, heat spreaders; and include use of, for example, an AlN film, or in the alternative, a GaN, film and/or an InN film deposited on a substrate by atomic layer annealing as a buffer/template layer for further crystalline film growth thereon by, for example, sputtering, in the fabrication of films/layers for use as, for example, heat spreaders and/or heat dissipation films/layers.

The term "substrate," as used herein, can broadly refer to any layer and/or surface upon which processing is desired. Thus, for example, a native oxide film on the surface of a silicon substrate may itself be considered a substrate for the purposes of this discussion. Likewise, layers deposited on silicon or on other base substrates may likewise be considered substrates in some embodiments. For example, in some embodiments, a multi-layer stack may be formed, and then atomic layer deposition and/or atomic layer annealing may be performed on the top layer, or a surface of the top layer, of the stack. In such a case, the top layer may be considered the substrate. In general, the layer or layers upon which the chemical precursor is deposited and/or which reacts with the chemical precursor can be considered the substrate layer(s). The material for the substrate may be any that may be appreciated by one of skill in the art in the field of electronics and/or semiconductors. In some embodiments, materials for the substrate include, for example, Si, $SiO_2$/Si, GaN, SiC, GaAs, and/or InGaAs.

The substrate, according to some embodiments, may include, but are not limited to, wafers. The wafers may be of various suitable processing sizes. For example, substrate samples may be on the order of 1 inch or smaller, if desired. Additionally, full wafers of about 200 mm or about 300 mm in diameter, or even larger substrates may be incorporated.

The term "atomic layer deposition" (ALD) and "atomic layer annealing" (ALA), as used herein, can broadly refer to the level of layer dimensional control that can be achieved at the angstrom (Å) level. Thus, atomic layer deposition may generally correspond to the size of atoms and/or molecules. The average added layer thickness per cycle of ALD/ALA can be less than 1 Å (0.1 nm) per deposition cycle, for example, about 0.5 Å, about 0.6 Å, about 0.7 Å, about 0.8 Å, about 0.9 Å, about 1 Å, or more than 1 Å, for example, about 1.1 Å, about 1.2 Å, about 1.3 Å, about 1.4 Å, about 1.5 Å, about 2 Å, about 2.5 Å, about 3 Å, about 4 Å, about 5 Å, about 6 Å, about 7 Å, about 8 Å, about 9 Å, about 10 Å (1 nm), or any number between about 0.1-30 Å per deposition cycle. In some embodiments, the average added layer thickness per cycle is between about 0.1-4 Å, about 0.5-4 Å per deposition cycle, about 0.6-4 Å, about 0.7-4 Å per deposition cycle, about 0.8-4 Å per deposition cycle, about 0.9-4 Å per deposition cycle, or about 1-4 Å per deposition cycle. Similarly, the number of deposition cycles in the ALD/ALA process is not particularly limited, and may be any number of cycles that would be appreciated by one of skill in the art. For example, the number of deposition cycles in the process may be between 1 and about 1,000 cycles. In some embodiments, the number of deposition cycles may be between about 1-600 cycles, for example, 1cycle, about 5 cycles, about 10 cycles, about 20 cycles, about 30 cycles, about 40 cycles, about 50 cycles, about 75 cycles, about 100 cycles, about 150 cycles, about 200 cycles, about 250 cycles, about 300 cycles, about 350 cycles, about 400 cycles, about 450 cycles, about 500 cycles, about 550 cycles, or about 600 cycles, or any number of deposition cycles between and including 1 deposition cycle and about 1,000 deposition cycles.

Regarding ALA, in addition to, for example, exposing a substrate to at least one cycle of a pulse of an organometallic chemical precursor and a pulse of a co-reactant of a conventional ALD process, optionally including a purge between the pulse, or pulses, of precursor and co-reactant, ALA may include a plasma treatment, such as an inert/noble gas plasma treatment with, for example, argon (Ar), neon (Ne), krypton (Kr), or helium (He) plasma, under a bias voltage, for example, about −5 V, −10 V, about −15 V, about −20 V, about −25 V, about −30 V, about −40 V, about −50 V, or about −75 V bias voltage. In some embodiments, the bias voltage in the plasma treatment is between about −5 V and about −75 V. In some embodiments the bias voltage in the plasma treatment is between about −25 V to about −40 V. The plasma treatment may occur after each ALD cycle, after every other ALD cycle, or regularly after any number of ALD cycles. In some embodiments, the plasma treatment for an ALA is provided after each ALD cycle of an organometallic chemical precursor pulse and a nitrogen-containing co-reactant pulse. In some embodiments, the plasma treatment for an ALA is provided after every other ALD cycle of an organometallic chemical precursor pulse and a nitrogen-containing co-reactant pulse. In some embodiments, the plasma treatment for an ALA is provided after every third ALD cycle of an organometallic chemical precursor pulse and a nitrogen-containing co-reactant pulse.

It will be appreciated that temperatures at which methods of deposition of films/layers of the inventive concept should be such that the methods of deposition are compatible with back end of line (BEOL) processing and integration. In some embodiments, the temperature at which methods of the present inventive concept take place is less than or equal to about 400° C. In some embodiments, the temperature at which methods of the present inventive concept take place is less than or equal to about 450° C., less than or equal to about 500° C., less than or equal to about 550° C., or less than or equal to about 580° C. In some embodiments, the temperature at which methods of the present inventive concept take place is between about and including 350° C. and about and including 400° C. In some embodiments, the temperature at which methods of the present inventive concept take place is between about and including 350° C. and about and including 580° C.

The pressures at which methods and steps in the methods of the present inventive concept are not particularly limited, and may be any pressure that would be envisioned by one of skill in the art to perform the methods and steps in the methods as described herein. For example, the organometallic chemical precursor pulse(s) and the nitrogen-containing co-reactant pulse(s) may be performed at pressures between about $10^{-8}$ Torr to about $10^{-6}$ Torr, or between about $10^{-7}$ Torr to about $10^{-6}$ Torr. The pressures at which the plasma treatment takes place may be between about $10^{-4}$ Torr to about $10^{-2}$ Torr, for example, but not limited to, about $4 \times 10^{-3}$ Torr or about $5 \times 10^{-3}$ Torr.

In some embodiments of the present inventive concept, provided is a method for depositing films on a sample and/or substrate for use in, for example, heat dissipating applications, such as for use in heat spreaders, including depositing, for example, AlN, using organometallic chemical precursors, such as, for example, tris(dimethylamido)aluminum (TDMAA) and/or tris(diethylamido)aluminum (TDEAA), in conjunction with nitrogen-containing co-reactants, such as hydrazine ($N_2H_4$) and/or $NH_3$, via ALA using an inert gas plasma, for example, argon (Ar), neon (Ne), krypton (Kr), or helium (He), In some embodiments, the gas used in the plasma treatment is Ar. In some embodiments, the gas used in the plasma treatment is Kr. Crystallinity of the film may be varied by the bias voltage and/or pressure applied during deposition to the sample. The film applied by ALA may be a buffer/template layer, on which a further layer may be grown. In some embodiments, the buffer/template layer may be a strain relief layer on which a thick (e.g., thicker than about 70 nm, such as 200-300 nm thick) polycrystalline layer of AlN may be deposited. In some embodiments, the average grain size of AlN in the layers may be about 6-25 nm, for example, about 6-8 nm, about 10-25 nm, or about 20-25 nm. In some embodiments, the average grain size of the AlN, i.e., AlN crystals, in the layers is greater than about 15 nm, greater than about 16 nm, greater than about 17 nm, greater than about 18 nm, greater than about 19 nm, or greater than about 20 nm in size. In some embodiments, the average grain size of the AlN in the layers is in a range of about 10-30 nm, about 15-30 nm, or about 15-25 nm. In some embodiments, the average grain size of the AlN in the layers may be about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, about 25 nm, about 26 nm, about 27 nm, about 28 nm, about 29 nm, or any value between about and including 10 nm and about and including 30 nm, or any value between about and including 15 nm and about and including 30 nm. In some embodiments, the buffer/template layer may be crystalline or polycrystalline in character. In some embodiments, the buffer/template layer may be amorphous in character. In some embodiments, the average grain size of the AlN in the buffer/template layer may be about the same as the thickness of the buffer/template layer on the substrate. In some embodiments, the AlN in the buffer/template layer includes oriented c-axis AlN.

It will be appreciated that in cases in which crystalline layers thicker than about 70 nm are deposited directly on a substrate of Si, such as Si (111) or Si (100), or $SiO_2$/Si or GaN or SiC or GaAs or InGaAs, macroscopic cracks tend to form due to the high compressive stress in the crystalline layer. According to some embodiments of the inventive concept, by using a thin, for example, but not limited to, an about 20-25 nm buffer/template layer of AlN, in some embodiments, oriented c-axis AlN, deposited first on Si or $SiO_2$/Si or GaN or SiC or GaAs or InGaAs, stress in the film grown on top of the buffer layer can be controlled, and a, for example, but not limited to, 290 nm thick crystalline or polycrystalline layer that is primarily (002) and (103) textured AlN can be deposited by, for example, ion plating, by chemical vapor deposition (CVD), metalorganic chemical vapor deposition (MOCVD), or by sputtering/sputter deposition. Accordingly, in some embodiments of the present inventive concept, films that are about 100-500 nm thick, about 100-400 nm thick, about 150-400 nm thick, about 200-400 nm thick, or about 200-300 nm thick having a thermal conductivity of about 70 $Wm^{-1}K^{-1}$, about 80 $Wm^{-1}K^{-1}$, about 90 $Wm^{-1}K^{-1}$, about 100 $Wm^{-1}K^{-1}$, or even greater, can be prepared.

In cases in which the buffer/template layer is deposited by ALA, for example, a 25 nm buffer/template layer deposited by ALA using, for example, precursors such as TDMAA and $N_2H_4$, a 290 nm polycrystalline sputtered AlN layer, for example, can be deposited on the buffer/template layer having crystalline grain sizes of about 20-25 nm, similar to that of the template. By increasing grain size in the film, grain boundaries in the film will be decreased, and greater thermal conductivities than, for example, about 70 $Wm^{-1}K^{-1}$, about 80 $Wm^{-1}K^{-1}$, about 90 $Wm^{-1}K^{-1}$, about 100 $Wm^{-1}K^{-1}$, or even greater, up to the theoretical limit for the thermal conductivity of the material chosen, can be expected for films prepared according to the present inventive concept.

Accordingly, methods of forming a polycrystalline film and/or forming a heat dissipating/heat spreading layer/film on a substrate may include at least one cycle of an ALA process to provide a polycrystalline buffer/template film/layer, followed by deposition of a second polycrystalline film/layer on the polycrystalline buffer/template layer. The method provides a polycrystalline film and/or a heat dissipating/heat spreading layer film with superior characteristics, e.g., larger average crystal/grain size and higher thermal conductivity, as well as may be prepared at lower temperatures than are provided conventionally.

The at least one cycle of an ALA process in the formation of the buffer/template layer according to methods of the inventive concept may include: exposing a surface of a substrate to an organometallic chemical precursor, to provide an organometallic chemical precursor layer on the surface of the substrate; exposing the organometallic chemical precursor, i.e., the layer thereof on the substrate, to a nitrogen-containing co-reactant to provide a metal-nitride layer on the substrate; and treating the metal nitride layer with an inert gas plasma to provide a polycrystalline metal-nitride buffer/template layer. According to embodiments of the inventive concept, the organometallic chemical precursor and the nitrogen-containing co-reactant are not particularly limited, and any such precursor or co-reactant may be used that will provide a metal-nitride film, as would be appreciated by one of skill in the art. In some embodiments, the metal-nitride film/layer provided is aluminum nitride (AlN). In some embodiments, the metal-nitride film/layer provided gallium nitride (GaN). In some embodiments, the metal-nitride film/layer provided indium nitride (InN). In some embodiments, the organometallic chemical precursor is tris(dimethylamido)aluminum (TDMAA). In some embodiments, the organometallic chemical precursor tris (diethylamido)aluminum (TDEAA). In some embodiments, the nitrogen-containing co-reactant is hydrazine ($N_2H_4$). In some embodiments, the nitrogen-containing co-reactant is ammonia ($NH_3$). The inert gas plasma, in some embodiments of the inventive concept, may be an argon (Ar) plasma, and bias voltage and/or pressure during application of the inert gas plasma in the ALA process may be used to impart, alter, and/or vary the crystallinity/polycrystallinity of the buffer/template film/layer.

The buffer/template film/layer provided by embodiments of the inventive concept may serve as a strain relief fil/layer on which a thick polycrystalline metal-nitride film/layer, for example a thick AlN film/layer, may be deposited. Deposition of the thick polycrystalline metal-nitride layer may be performed by, for example, ion plating, CVD, MOCVD, and/or sputtering as will be appreciated by one of skill in the art. In some embodiments, deposition of the thick polycrystalline metal-nitride layer is performed by sputtering. Deposition of this thick polycrystalline metal-nitride film/layer on the buffer/template film/layer, according to embodiments of the inventive concept, can provide a metal-nitride film/layer, for example, an AlN film/layer, having superior characteristics and is suitable for heat dissipating/heat spreading applications in, for example, BEOL applications/integration in electronic/semiconductor devices. Having described various aspects of the present invention, the same will be explained in further detail in the following examples, which are included herein for illustration purposes only, and which are not intended to be limiting to the invention.

EXAMPLES

Deposition of High Thermal Conductivity AlN Heat Spreader Films

Example 1

The reaction chamber (ALD chamber, FIG. 1) is pumped by a turbomolecular drag pump while the sputter chamber has a turbomolecular pump and rotary vane pump in series. Both chambers have sample heating and the capability to transfer samples between systems without breaking vacuum. The base pressure of the reaction chamber is $\sim7\times10^{-7}$ Torr while the base pressure of the sputter chamber is $\sim1\times10^{-6}$ Torr. The ALD chamber walls are set to 90° C., TDMAA and its corresponding dosing lines are heated to ~105° C. and dosing lines/precursor containers for TMA and $N_2H_4$ are kept at room temperature. Pneumatic valves are controlled by a Lab VIEW computer program are employed to precisely regulate the valve opening times. A processed sample can be transferred into an ultra-high vacuum chamber equipped with an X-ray Photoelectron Spectroscopy (XPS) for characterization. Two different schemes were used to form the AlN template film, neither of which relies on a $N_2$ or $NH_3$ plasma. It is noted that $N_2$ plasma can be problematic in production tool because uniformity over large areas is problematic due to atomic N recombination. $NH_3$ plasmas can present challenges with hydrogen incorporation into the films. In the first scheme, TMA is sequentially pulsed with $N_2H_4$ with an argon plasma treatment after each $N_2H_4$ pulse at a temperature of 225-300° C. During this argon treatment, the energy of the incoming ions is controlled by the voltage of the stage bias which in turn gives control over the film properties (e.g., film texture, stress, etc.). The second scheme is similar to the first but uses TDMAA and hydrazine at temperatures >350° C. In the second scheme, the as-deposited films are already polycrystalline, and the ion anneal serves to enhance this crystallinity. TDMAA is critical since TMA decomposes close to 350° C.

EXPERIMENTAL PROCEDURES

Sample Preparation
(1) Si (111) substrates, are degreased using acetone, methanol and deionized water sequentially.
(2) After the degrease, all the samples are cleaned in a 2.0% HF solution for 30 seconds followed by a DI water rinse.
(3) The samples are mounted on a sample holder and loaded into the load lock of the ALD/sputter tool.

Deposition Process
A. TMA+$N_2H_4$ ALA at 225-300° C.
(1) HF cleaned Si samples are placed on a sample stage heated by a cartridge heater to the reaction temperature of 225-300° C.
(2) TMA and $N_2H_4$ are sequentially dosed separated by a pump time of ~15 s.
(3) Ar gas is introduced into the chamber at a pressure of ~30 mTorr, the ICP plasma source is ignited and the pressure is reduced to ~4 mTorr. The sample is exposed to ~20 s of plasma at a stage bias of −25 V pulsing at 10 Hz.
(4) Depending on the template thickness needed, 100-200 ALD cycles are repeated and XPS can be performed in situ to monitor the chemical composition of the film.

B. Pulsed CVD TDMAA+$N_2H_4$ at 350-400° C.
(1) HF cleaned Si samples are placed on a sample stage heated by a cartridge heater to the reaction temperature of >350° C.
(2) TDMAA and $N_2H_4$ are sequentially dosed separated by a pump time of ~15 s.
(3) Optionally, Ar gas is introduced into the chamber at a pressure of ~30 mTorr, the ICP plasma source is ignited and the pressure is reduced to ~4 mTorr. The sample is exposed to ~20 s of plasma at a stage bias of −25 V pulsing at 10 Hz.
(4) Depending on the template thickness needed, 100-200 ALD cycles are repeated and XPS can be performed in situ to monitor the chemical composition of the film.

Results of the Atomic Layer Anneal (ALA)/CVD Deposition Process

Figure 2:
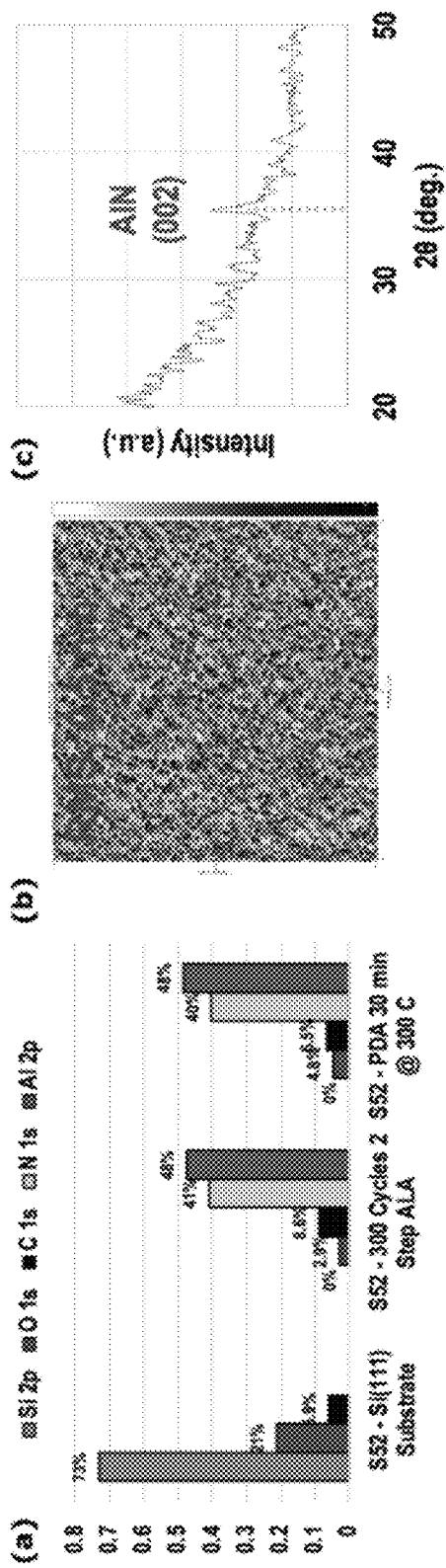
FIG. 2: (panel a) XPS of 300 cycles (~30 nm) of AlN ALA using TMA and $N_2H_4$ at 225° C. using a 400 ms pulse of TMA, a 100 ms pulse of $N_2H_4$, and 15 s purge times. Before post deposition anneal (PDA), oxygen in the film is <3% and the PDA removes some carbon consistent with a fraction of it being surface hydrocarbon that is not incorporated into the film. (Panel b) ex situ atomic force micrograph of the AlN film. Roughness of 0.5 nm consistent with the ion bombardment not inducing any appreciable roughening of the film. (Panel c) ex situ x-ray diffractogram shows the formation of AlN (002). FWHM of the peak is 0.52 degrees, corresponding to a crystallite size of ~17 nm.

Using TMA+$N_2H_4$ with ALA treatment, we are able to deposit polycrystalline AlN without the use of a nitrogen-containing plasma at 225° C. As can be seen in FIG. 2, contamination in the film (<3% O, <7% C) was noted even at these low temperatures and atomic force microscopy showed smooth films. X-ray diffractograms showed the deposited films exhibit an extremely small full width at half max (FWHM) of ~0.52 degrees which estimates an average crystallite size of 17 nm.

Figure 3:
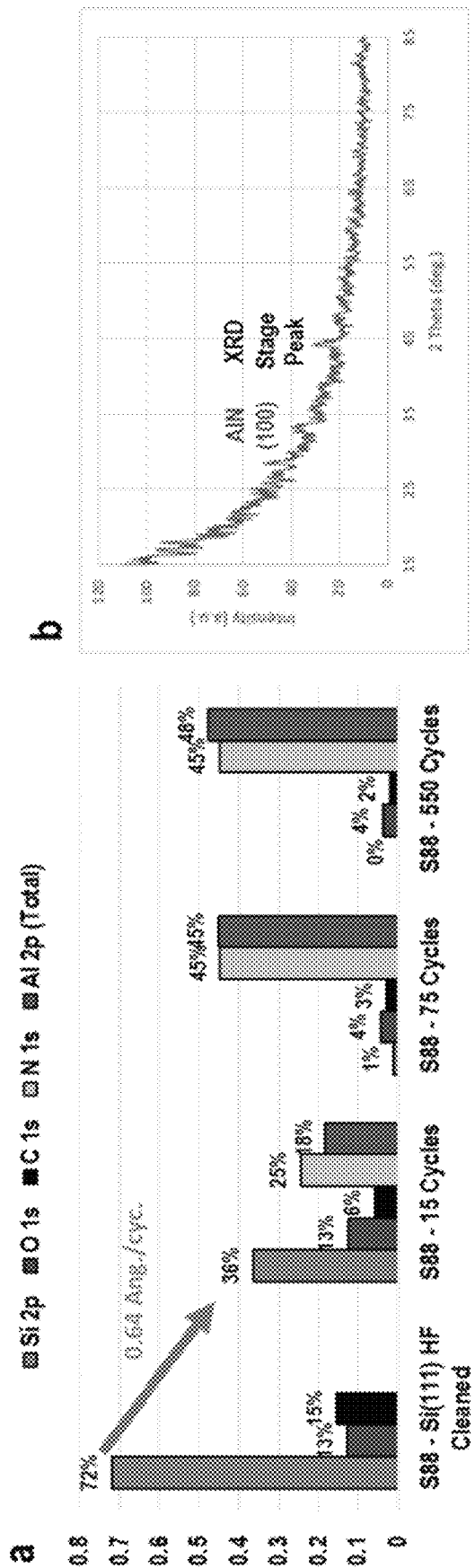
FIG. 3: (panel a) XPS of 550 cycles (~36 nm) of AlN grown by thermal ALD of TDMAA and $N_2H_4$ at 350° C. showing oxygen and carbon content in the film of 3.7% and 2.1%, respectively. Pulse times were 150 ms for TDMAA and 100 ms for $N_2H_4$. Purge times were 15 s for TDMAA and 30 s for $N_2H_4$. (Panel b) XRD showing an AlN (100) peak at about 33.5° 2θ.
Figure 4:
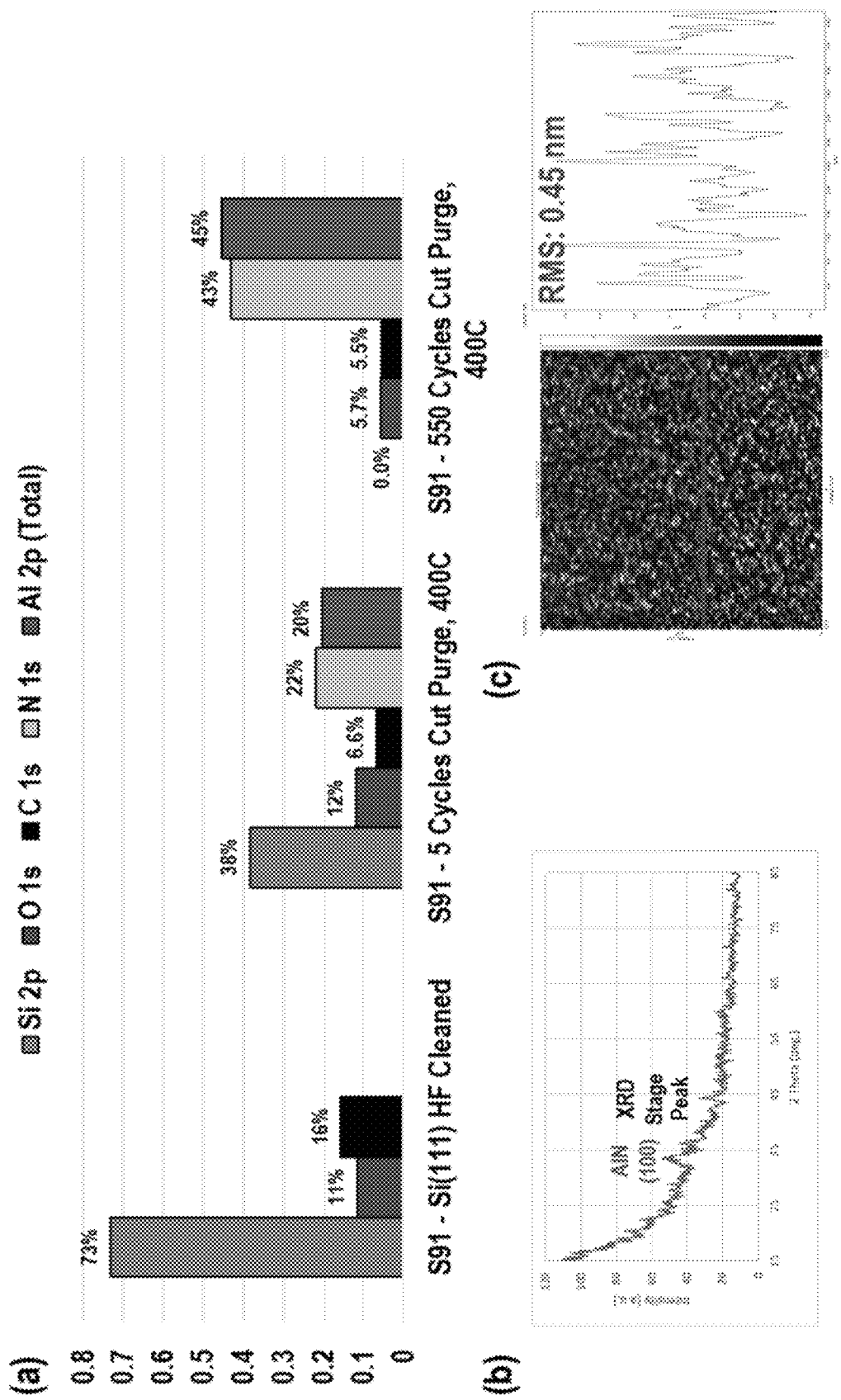
FIG. 4: (panel a) XPS of 550 cycles (~96 nm) of pulsed CVD AlN using TDMAA and $N_2H_4$ at 400° C. Pulse times were 150 ms for TDMAA and 100 ms for $N_2H_4$. Purge times were 4 s for both TDMAA and $N_2H_4$. Both oxygen and carbon in the film is ~5% (panel b) Ex situ x-ray diffractogram shows the formation of an AlN (100) peak having a larger FWHM, as compared to the TMA/$N_2H_4$ ALA process, of about 1.7 degrees, consistent with the formation of crystallites of about 5.8 nm in this process. (Panel c) ex situ atomic force micrograph of the AlN film. Roughness of 0.45 nm consistent with smooth pulsed CVD deposition.

Using thermal TDMAA+$N_2H_4$ ALD or ALD with a pulsed CVD component due to short purge times, we are able to deposit polycrystalline AlN without any ALA treatment at T >350° C. Thermal ALD produces a film with low oxygen and carbon contamination, and a slight AlN (100) at about 33.5° 2θ, shown below in FIG. 3. Thermal pulsed CVD, shown in FIG. 4, results show low film contamination (~5% O/C) and (100) textured AlN. Ex situ AFM shows films are still smooth despite the deposition occurring at a slightly higher growth rate than pure ALD growth (1.76 Å/cyc vs ~0.64 Å/cyc). However, the crystalline size decreases from 25 nm to ~1 nm when adding a CVD component to the pure ALD process.

Figure 5:
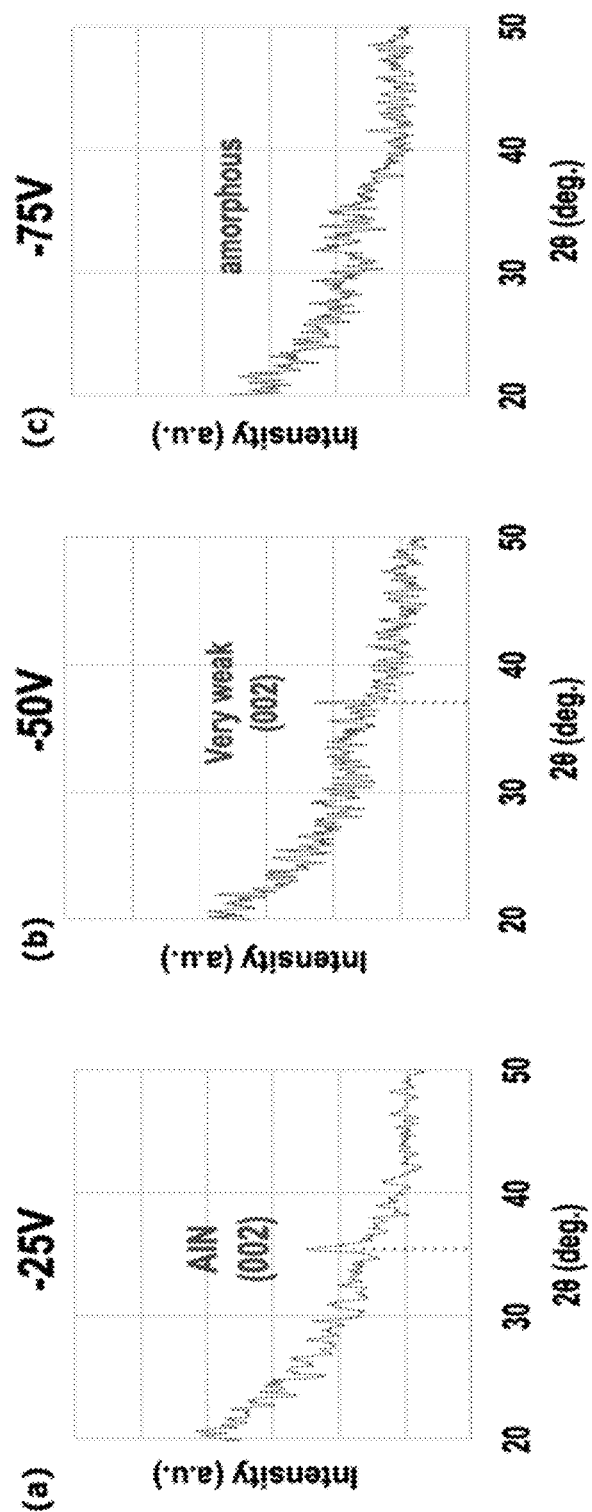
FIG. 5: X-ray diffraction of ~30 nm thick AlN films deposited using TMA+$N_2H_4$ ALA at different stage bias values. (Panel a) at −25 V, a clear AlN (002) peak is observed. (Panel b) at −50 V, the (002) peak is barely above the detection limit of the XRD tool. (Panel c) at −75 V, the sample displays no crystallinity in XRD.

Next, the effect of ion energy was studied. The DC bias voltage was used to modulate the ion energy and was changed from −25 VDC to −75 VDC. As can be seen in FIG. 5, there is a strong correlation between the bias energy and the crystallinity in the film.

Figure 6:
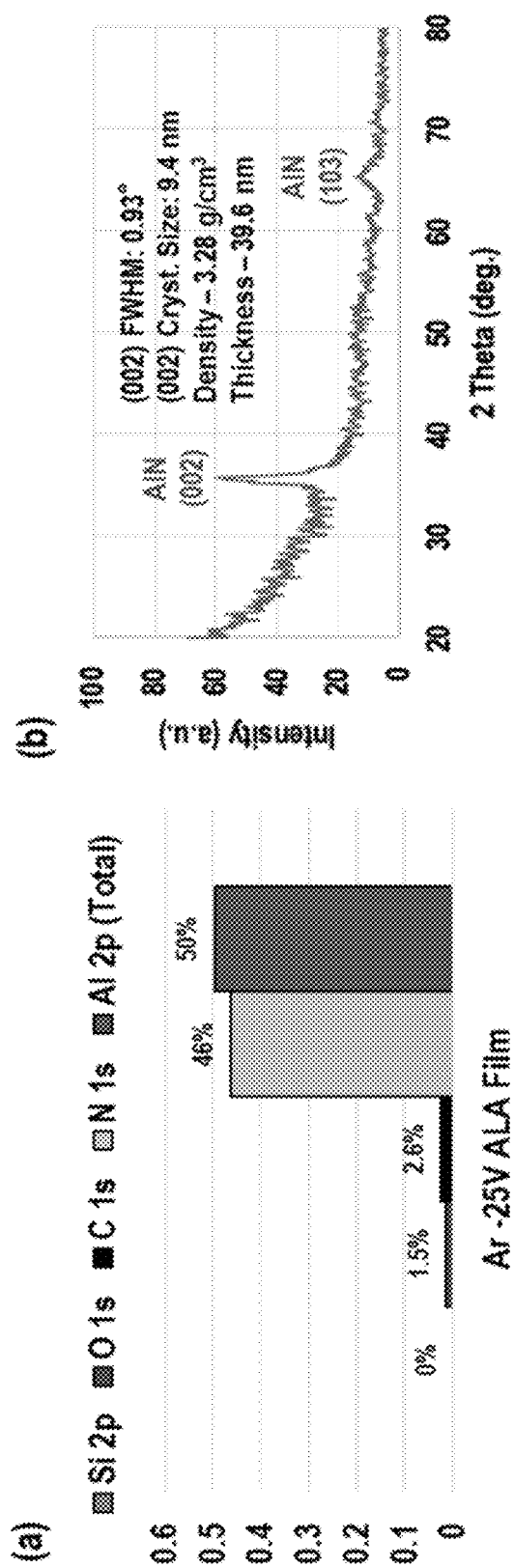
FIG. 6: (panel a) XPS of a ~40 nm AlN film using TDMAA and $N_2H_4$ with ALA treatment at 400° C. using a 150 ms pulse of TDMAA and a 100 ms pulse of $N_2H_4$, and an Ar plasma treatment for 20 s at −25 V bias voltage. Purge times were 4 s for TDMAA and 8 s for $N_2H_4$. Both oxygen and carbon in the film are sub-3 atomic %. (panel b) ex situ x-ray diffractogram shows (002) textured AlN and an average crystal size of about 9.4-10 nm.

When optimized conditions (Ar plasma treatment using a bias voltage of −25 V) for TMA/N$_2$H$_4$ ALA were applied to the TDMAA/N$_2$H$_4$ ALA, the atomic concentration of both oxygen and carbon were reduced to sub-3% and the texture changes from the (100)/(200) texture seen in the purely thermal pulsed CVD to a predominantly (002) texture with an FWHM of 0.93 degrees, corresponding to an estimated grain size of about 9.4 nm (See FIG. 6).

Figure 7:
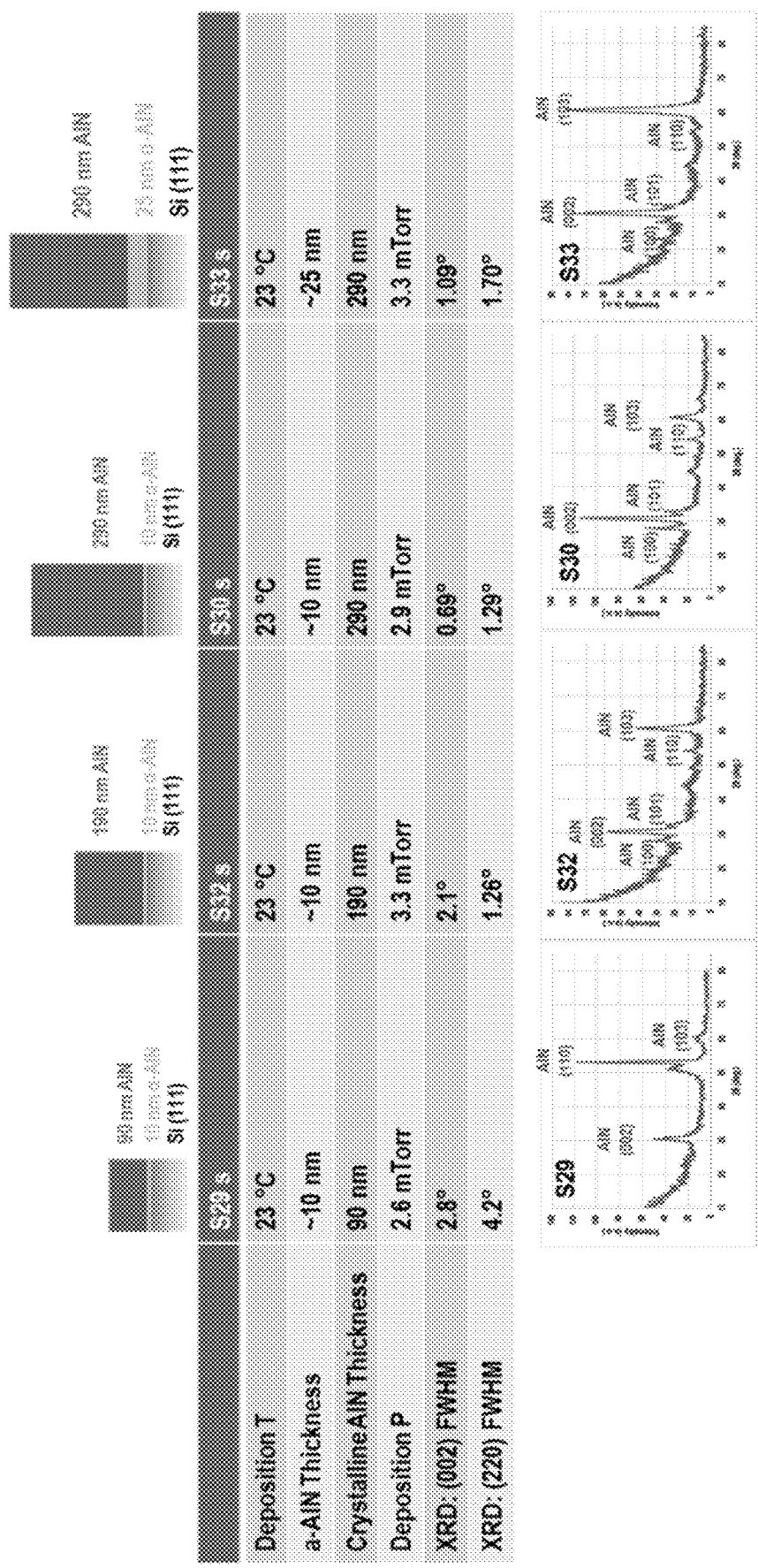
FIG. 7: Sputtered AlN using in situ strain relief layers. The crystalline AlN has a large amount of compressive strain as deposited and requires the use of a buffer layer. For the third sample (S30 s), the thickness of the crystalline layer was too high to be effectively compensated by the buffer layer and so there were macroscopic cracks observed. The fraction of AlN (002) increases as a function of crystalline film thickness for a given buffer layer thickness.

Although the ALA process with correct bias conditions allows for control of stress and creates films with large grain size, it is too slow to be economical for depositing the thicker films needed for heat spreaders. As such, we envision these layers be used as a template layer for further AlN growth either though polycrystalline CVD AlN or through physical vapor deposition (PVD). In order to simulate the effect of these engineered template layers on polycrystalline AlN growth and to benchmark their thermal conductivity, strain relief layers of amorphous AlN were deposited in situ via sputtering and polycrystalline AlN was then grown on top. By simply varying the pressure during deposition, the crystallinity and stress of the film may be controlled in a simple manner and the ability to perform the deposition of the strain relief layer both in situ as well as very quickly before the crystalline layer deposition are noted to be novel. As can be seen in FIG. 7, the relative fraction of (002) textured AlN increases as a function of film thickness for a given template layer thickness and the FWHM decreases, consistent with the formation of larger grains, although the FWHM exhibited is still larger than the FWHM of the ALA AlN reported in FIG. 2 and in FIG. 6.

Figure 8:
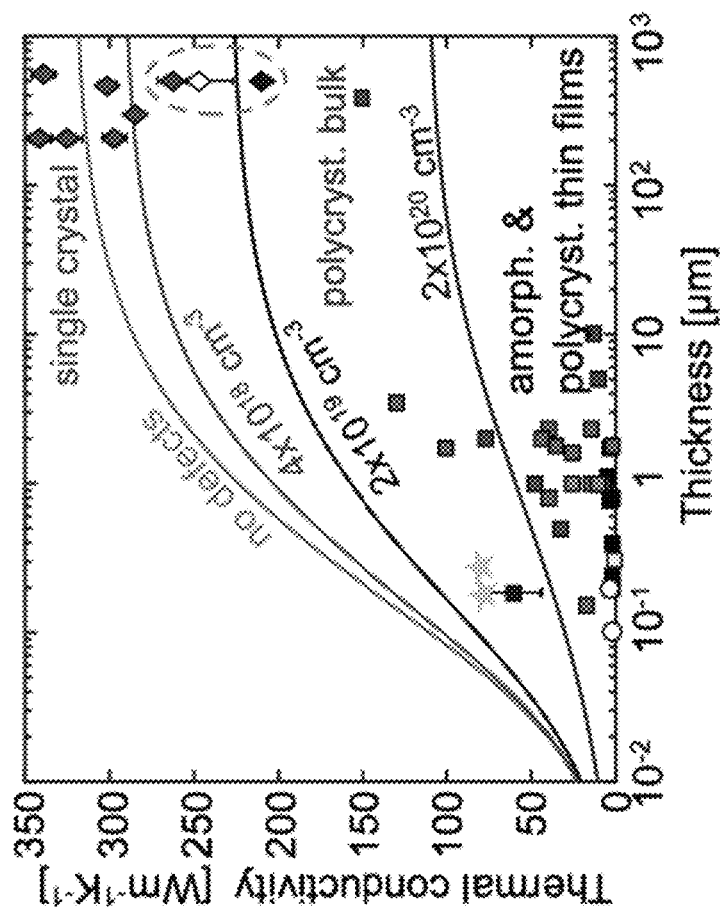
FIG. 8: TDTR measurements of S32 s/S33 s from FIG. 5 shown as gold stars against the benchmarking plot as shown previously [10]. Measurements indicate record thermal conductivities for films <1 μm thick and are within a factor of 2 for films several μm thick.

In order to benchmark the thermal conductivities of these deposited AlN films against what is reported in the literature, time-domain thermoreflectance (TDTR) measurements were performed, and it was calculated that the polycrystalline layers have a thermal conductivity of about 70 Wm$^{-1}$K$^{-1}$, even though the films are 200-300 nm thick. As can be seen in FIG. 8 below, this is the record value achieved for films sub-0.5 micron. Although the precise mechanism for this high thermal conductivity is not known, these films have extremely low oxygen content which would likely foster large grain growth and it is hypothesized that due to the relatively slow growth rates of these sputtered films (using no Ar gas), these films undergo more ion bombardment which may aid in the densification of the films.

Figure 9:
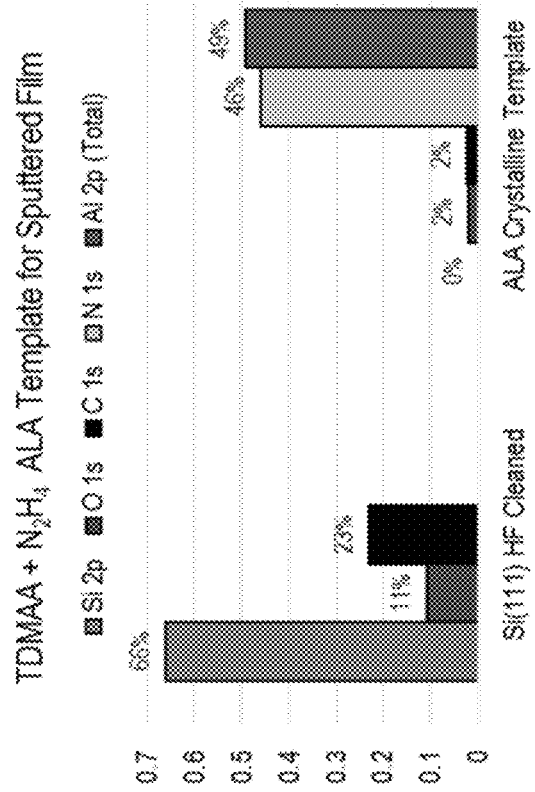
FIG. 9. Composition information by XPS and crystallographic information by GI-XRD for a film structure with 25 nm ALA template created using TDMAA and $N_2H_4$ ALA followed by 290 nm of polycrystalline sputtered AlN. (Panel a) The ALA template was deposited at 400° C. using a 150 ms pulse of TDMAA and a 100 ms pulse of $N_2H_4$. ALA was performed after each deposition cycle for 20 s at a bias of −25 V. (Panel b) GI-XRD of the combined structure showing (002), (100), (101), and (103) grains, with a (002) peak FWHM of 0.45 degrees. This corresponds to 20 nm grains for the (002) crystallites.

Combining the two techniques of ALA template and sputtered polycrystalline layer to form a stack structure reveals that the large grain size of the crystalline template can be maintained throughout the sputtered material. A sample structure was created with a 25 nm thick ALA template followed by sputtered deposition of 290 nm. Elemental composition for the template layer is shown in FIG. 9, panel a, and the XRD of the combined structure is shown in FIG. 9, panel b, and exhibits AlN (002), (100), (101) and (103) peaks. The FWHM for the (002) peak is 0.45°, corresponding to estimated grain size of 20 nm, which is similar to that of the template and much larger than that of the sputtered crystalline layer without ALA buffer (which for equivalent stack structure was ~7-8 nm). Note normally the 290 nm sputtered film would require an amorphous buffer layer on Si but the ALA AlN reduces the stress in the sputtered AlN film so no amorphous buffer layer is needed; this is a key advantage in heat spreaders since amorphous films at act as thermal barriers.

Example 2

Figure 10:
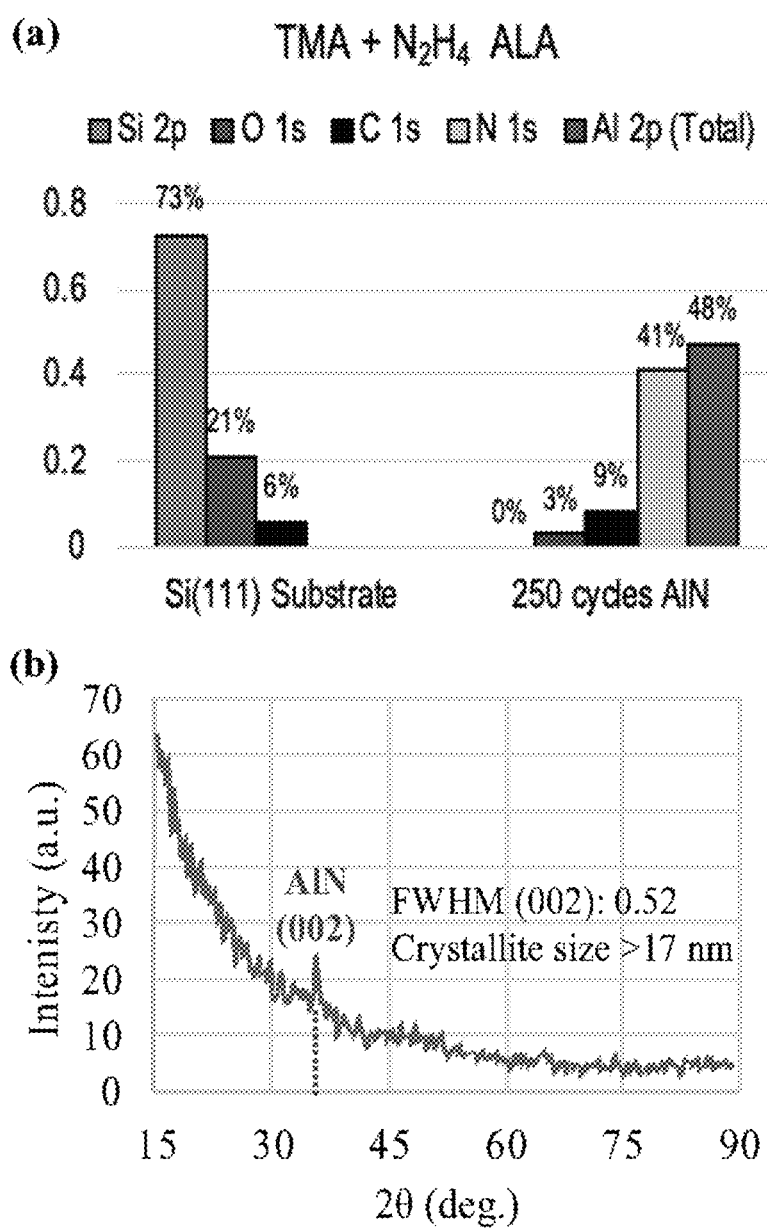
FIG. 10. XPS elemental composition and GI-XRD crystallographic information for 250 cycles of TMA+$N_2H_4$ ALA at 225° C. (Panel a) Using a 400 ms pulse of TMA, a 100 ms pulse of $N_2H_4$, 15 s pump times, and a 20 s Ar plasma treatment with a bias voltage of −25 V at 225° C., a 33 nm thick sample with low oxygen (3 at. %) is deposited. (Panel b) GI-XRD reveal a (002) texture with a relatively narrow FWHM of 0.52°.

Polycrystalline aluminum nitride was deposited via ALA using TMA with N$_2$H$_4$ and TDMAA with N$_2$H$_4$. Films were deposited on Si (111) substrates, which were treated with 2% HF to etch the native oxide layer. The ALA was performed at a substrate temperature of 225° C. with ion annealing performed after each ALD cycle for 20 s at a bias voltage of −25 V. Elemental composition information by x-ray photoelectron spectroscopy (XPS) is shown in FIG. 10, panel a. Residual carbon contamination of 9% is partially adventitious and can be reduced using an in situ post-deposition anneal. Grazing-incidence x-ray diffraction (GI-XRD) was performed on this film (FIG. 10, panel b) and shows preferential AlN (002) orientation. The full width half max of this (002) peak is 0.52°, which corresponds to a crystallite size of ~17 nm by the Scherrer Equation. This is an excellent grain size for a 33 nm thick film.

Figure 11:
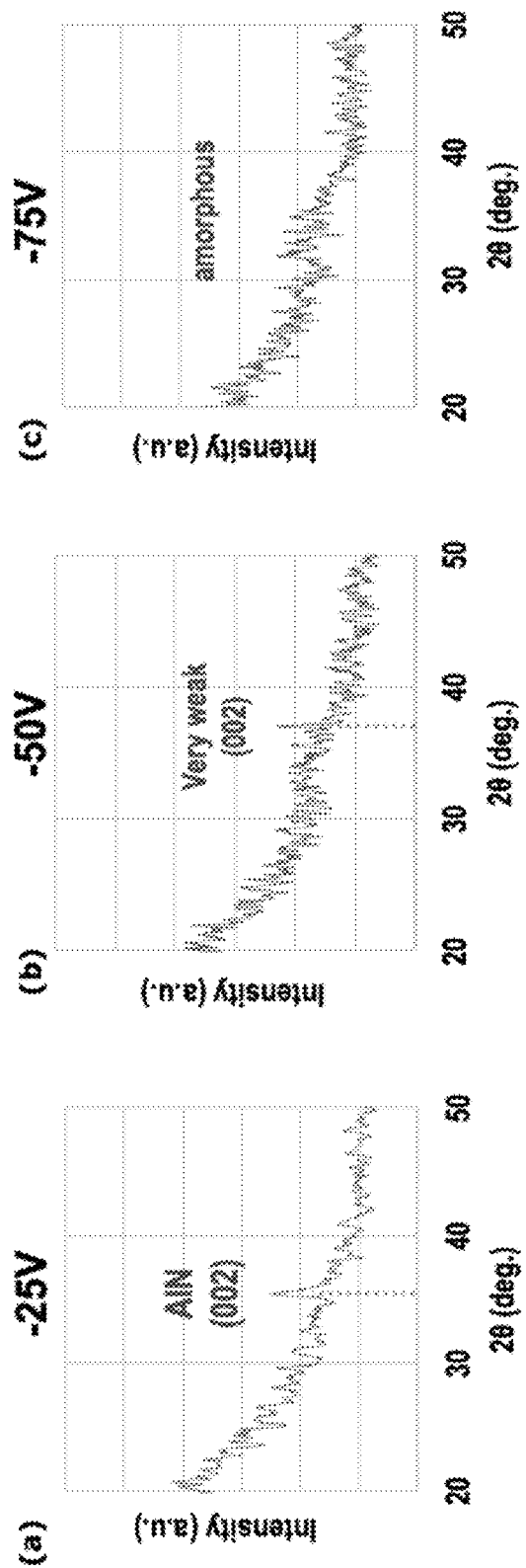
FIG. 11: X-ray diffractograms of TMA+$N_2H_4$ ALA at 225° C. at various bias voltages. (Panel a) At −25 V, there is a clear AlN (002) texture to the film. (Panel b) at −50 V, the AlN (002) peak is just above detection limits and (panel c) at −75 V, there is no detectable crystallinity.

During optimization of the ALA process, it was found that the crystallinity of the film was highly dependent on the bias applied to the sample. It is hypothesized that because the bias voltage modulates the energy of the incoming ions, there is an optimal energy that facilitates adatom migration and minimizes defect generation. The effect of ion energy modulation can be seen in FIG. 11.

Figure 12:
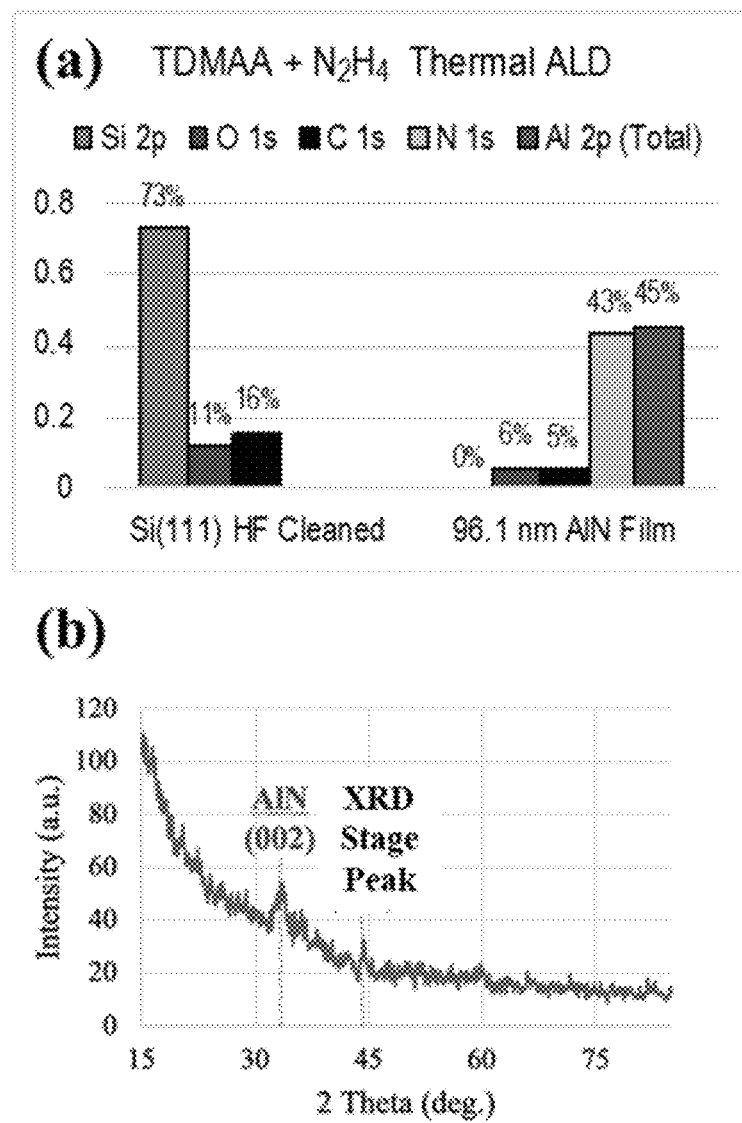
FIG. 12. XPS elemental composition and GI-XRD crystallographic information for 550 cycles of pulsed CVD TDMAA+$N_2H_4$ at 400° C. (Panel a) Using a 150 ms pulse of TDMAA, a 100 ms pulse of $N_2H_4$, and short 4 s purges without Ar plasma treatment at 400° C., a 96.1 nm thick sample is deposited. (Panel b) GI-XRD data show the purely thermal process yields AlN (002) texture with a broad FWHM value of 1.7°.

Deposition of polycrystalline AlN was also achieved by purely thermal pulsed CVD of TDMAA and N$_2$H$_4$ at substrate temperatures as low as 350° C. Representative elemental composition information by XPS for a sample deposited at 400° C. is shown in FIG. 12, panel a. Films deposited using this method have slightly less carbon (5 at %), than the TMA+N$_2$H$_4$ ALA at 225° C., ostensibly due to the higher reaction temperatures. Though the film displays (002) texture by GI-XRD (FIG. 12, panel b), the peak is quite broad, with an FWHM value of 1.7° for the (002) peak, which corresponds to a crystallite size of ~5.8 nm.

The ALA technique was used to enhance the crystallinity of the thermal TDMAA and N$_2$H$_4$ process. Representative elemental composition information by XPS is shown in FIG. 6, panel a, which shows that these films have extremely low levels of carbon and oxygen contamination (less than 3 atomic %). XRD performed of this film showed markedly enhanced crystallinity (FIG. 6, panel b). The full width at half max for the (002) peaks observed is about 0.85°-0.93°. By the Scherrer Equations, this corresponds to a grain size of about 9.4-10 nm.

Figure 14:
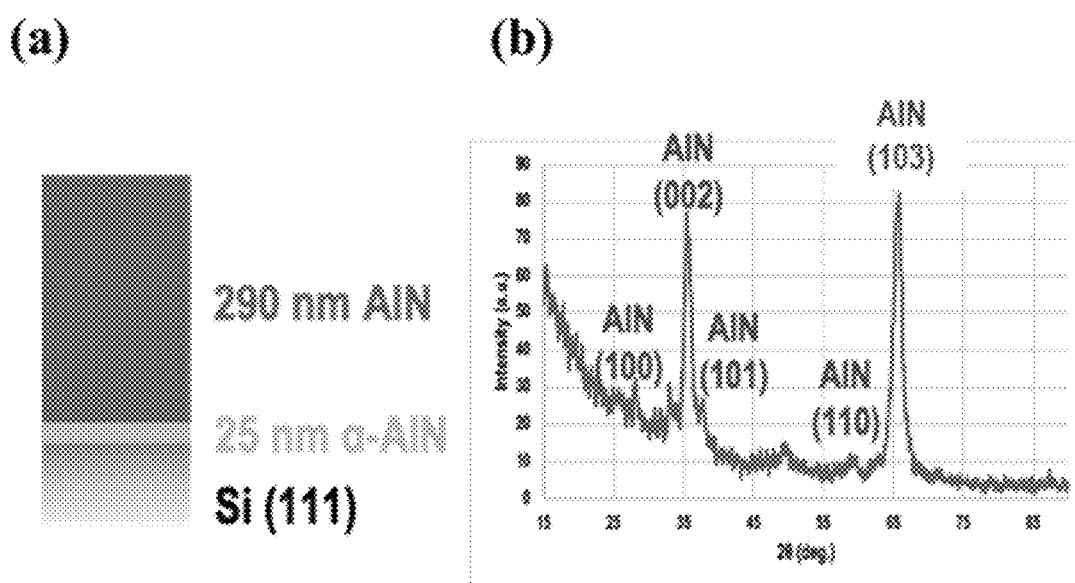
FIG. 14. XPS elemental composition and GI-XRD crystallographic information for 250 cycles of TMA+$N_2H_4$ ALA at 225° C. (Panel a) XPS elemental composition for 250 cycles of TMA+$N_2H_4$ ALA at 225° C. Using a 400 ms pulse of TMA, a 100 ms pulse of $N_2H_4$, 15 s pump times, and a 20 s Ar plasma treatment with a bias voltage of −25 V at 225° C., a 33 nm thick sample with low oxygen (3 at. %) is deposited. (Panel b) GI-XRD data for a 33 nm thick film grown using TMA and $N_2H_4$ ALA. Preferential grain orientation of (002), with 0.52° peak FWHM corresponds to ~17 nm grains.

Though ALA films are high-quality and have large grain size, the slow deposition rate of ~8 nm/hr likely limits its use to a buffer/template layer for further crystalline growth as heat spreading stacks are usually several hundred nanometers to microns thick. In order to study the crystallinity and thermal conductivity of the sputtered AlN alone, strain relief layers of amorphous AlN were deposited in situ via sputtering and high compressive stress polycrystalline AlN was then grown on top. By simply varying the pressure during deposition, the crystallinity and stress of the film may be controlled in a simple manner and the ability to perform the deposition of the strain relief layer both in situ as well as very quickly before the crystalline layer deposition are novel. Due to the high compressive stress in the crystalline layer, films thicker than ~70 nm deposited directly on Si form macroscopic cracks. Using a thin, 25 nm buffer layer of amorphous AlN deposited in situ, stress in the film can be controlled and a 290 nm thick crystalline layer that is primarily (002) and (103) textured AlN was deposited. XRD shows peak FWHM of 1.1° and 1.7°, respectively (FIG. 14). It is hypothesized that by using ALA-engineered template layers with large grain size (like those in FIG. 6), higher thermal conductivity may be achieved for the sputtered films while retaining control over film stress.

In order to benchmark the thermal conductivities of these sputtered AlN films with thin buffer layer against what is reported in the literature, time domain thermoreflectance (TDTR) measurements were performed and it was calculated that the polycrystalline sputtered layers have a thermal conductivity of about 70 $Wm^{-1}K^{-1}$ even though the films are 200-300 nm thick. To the best of our knowledge, this is the record value achieved for films sub-0.5 micron thick. Although the precise mechanism for this high thermal conductivity is not known, it is hypothesized that due to the relatively slow growth rates of these sputtered films (using no Ar gas), these films undergo more ion bombardment which assists in the densification of the films. As thermal conductivity has a strong correlation to both defect density as well as thickness, it is expected that by both optimizing the buffer/template layer as well as by scaling the crystalline layer, films with higher thermal conductivity may be obtained.

The two deposition techniques were employed sequentially to create stacked a structure. First, a crystalline template was deposited using TDMAA+$N_2H_4$ ALA. Second, a polycrystalline sputtered AlN layer was deposited. XRD reveals that the large grain size of the crystalline template can be maintained throughout the sputtered material. A sample structure was created with a 25 nm thick ALA template followed by sputtered deposition of 290 nm. Elemental composition for the template layer is shown in FIG. 9, panel a, and the XRD of the combined structure is shown in FIG. 9, panel b. The FWHM for the (002) peak is 0.45°, corresponding to estimated grain size of 20 nm which is similar to that of the template thickness and much larger than that of the sputtered crystalline layer without ALA buffer (6-8 nm); the increase in grain size would correspond to a ~30× deduction in grain boundaries.

The ALA of AlN using TMA or TDMAA and $N_2H_4$ demonstrate the ability of the technique to grow high-quality, crystalline films with large grain size and the ability to template further growth. Fine tuning of the plasma treatment parameters should enable the formation of films with even larger grains which can then be used to template further high speed polycrystalline AlN growth via sputtering. By minimizing the oxygen content, the high deposition rate sputtered layers of 200-300 nm demonstrate thermal conductivities of at least about 70 $Wm^{-1}K^{-1}$ and it is expected that further optimization in combination with the ALA and scaling will yield results in excess of 100 $Wm^{-1}K^{-1}$.

References, Example 2

[1] R. L. Xu, M. M. Rojo, S. M. Islam, A. Sood, B. Vareskic, A. Katre, N. Mingo, K. E. Goodson, H. G Xing, D. Jena, E. Pop, "Thermal conductivity of crystalline AlN and the influence of atomic-scale defects," J. Appl. Phys. 126, 185105 (2019).
[2] C. Y. Ho, R. W. Powell, and P. E. Liley, J. Phys. Chem. Ref. Data 1 (2), 279 (1972).
[3] E. Sichel, R. Miller, M. Abrahams, and C. Buiocchi, Phys. Rev. B 13 (10), 4607 (1976).
[4] R. Rounds, B. Sarkar, D. Alden, Q. Guo, A. Klump, C. Hartmann, T. Nagashima, R. Kirste, A. Franke, M. Bickermann, Y. Kumagai, Z. Sitar, and R. Collazo, J. Appl. Phys. 123 (18), 185107 (2018).
[5] M. Mizuta, S. Fujieda, Y. Matsumoto, T. Kawamura, Japanese J. Appl. Phys. 25 (12), L945-L948 (1986).
[6] R. G. Gordon, U. Riaz, and D. M. Hoffman, J. Mater. Res., 7 (7) (1992).
[7] A. I. Abdulagatov, S. M. Ramazanov, R. S. Dallaev, E. K. Murliev, D. K. Palchaev, M. K. Rabadanov, I. M. Abdulagatov, Russian Microelec. 47 (2), 118-130 (2018).

Example 3

Adapting optimized TDMAA and $N_2H_4$ thermal ALD conditions to atomic layer annealing experiments produces films with similar purity, but enhanced crystallinity. Representative XPS data, shown in FIG. 6, panel a, demonstrates low oxygen and carbon contamination, of less than 2% and less than 3% respectively. GI-XRD data, shown in FIG. 6, panel b, reveals preferential (002) grain orientation and a small amount of (103) grain orientation present.

Figure 13:
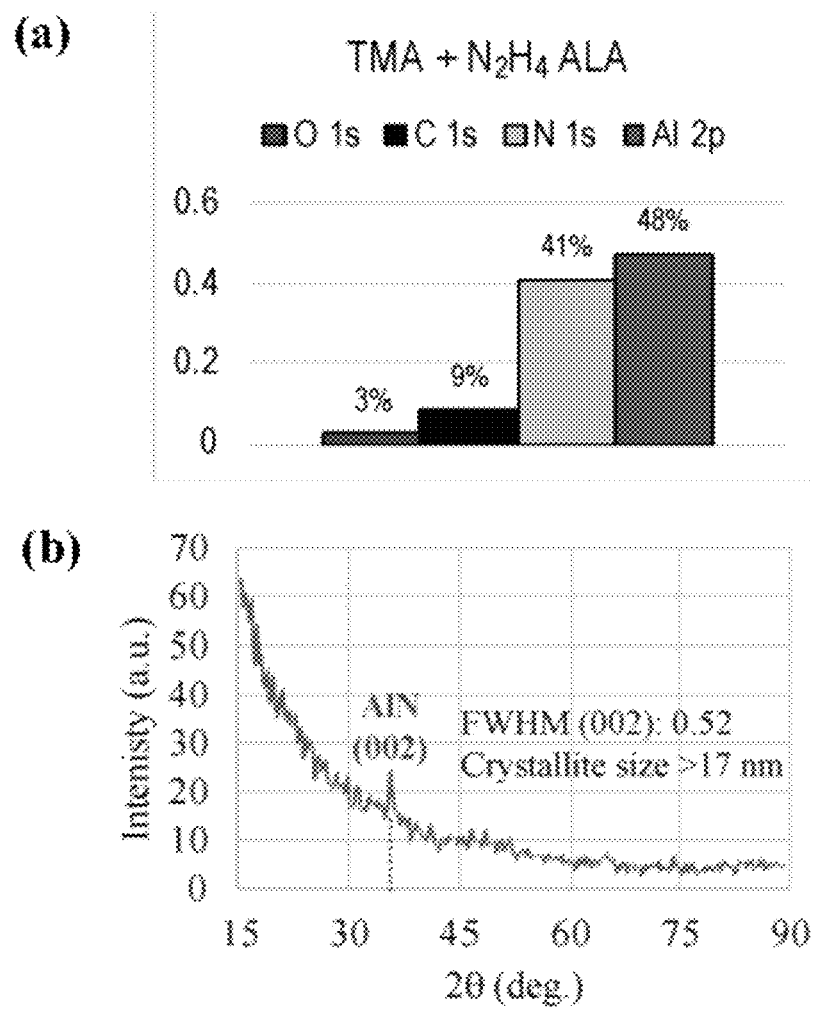
FIG. 13. Characterization of in situ sputtered buffer layers (panel a) Schematic diagram and (panel b) corresponding X-ray diffractogram for sputtered crystalline films with a 25 nm amorphous buffer layer. Film is primarily (002)/(103) textured with a 1.1°/1.7° FWHM (average crystallite size ~6-8 nm).

TMA and $N_2H_4$ were used in an ALA experiment to grow a 33 nm thick film. Composition information for this sample is shown in FIG. 13, panel a, also demonstrating low oxygen and carbon contamination. The diffraction data, shown in FIG. 13, panel b, demonstrates preferential (002) grain orientation with a 17 nm crystallite size.

Films grown by reactive sputtering of Al with low pressure (~2.8 mTorr) 100% nitrogen plasma contain very little oxygen and demonstrate preferential (002) and (103) grain orientations, such as the 290 nm film shown in FIG. 14. A 25 nm layer of amorphous AlN serves as a strain relief layer, as films sputtered with pure $N_2$ contain large amounts of compressive strain. Diffraction data, FIG. 14, panel b, reveals (002) and (103) texture, with a 1.1° and 1.7° FWHM, corresponding crystallite sizes of 6 nm and 8 nm, respectively, as well as small amounts of (100), (101), and (110) orientations. This film was measured to have a thermal conductivity of 70 $Wm^{-1}K^{-1}$ by time domain thermoreflectance (TDTR), which is a record for films sub-0.5 micron thick.

A 24 nm thick template was grown using TDMAA and $N_2H_4$ ALA, with conditions similar to those described previously. Composition information for the template layer is shown in FIG. 9, panel a. Following this deposition, 290 nm of crystalline AlN were sputtered in-situ. Diffraction data shown in FIG. 9, panel b demonstrates the ability of the technique to retain the large crystallite size of the ALA template (~20-25 nm) throughout the sputtered material and have a crystalline interface to the substrate which is advantageous for thermal conduction.

The ALA of AlN using TMA or TDMAA and $N_2H_4$ demonstrate the growth of high-quality, crystalline films with large grain size and the ability to template further high speed polycrystalline AlN growth via sputtering. By minimizing the oxygen content, the high deposition rate sputtered layers of 200-300 nm demonstrate thermal conductivities of at least about 70 $Wm^{-1}K^{-1}$ and it is expected that further optimization in combination with the ALA and increase in crystalline layer thickness will yield results in excess of 100 $Wm^{-1}K^{-1}$.

References, Example 3

[1] M. Mizuta, S. Fujieda, Y. Matsumoto, T. Kawamura, Japanese J. Appl. Phys. 25 (12), L945-L948 (1986).

[2] R. G. Gordon, U. Riaz, and D. M. Hoffman, J. Mater. Res., 7 (7) (1992).
[3] A. I. Abdulagatov, S. M. Ramazanov, R. S. Dallaev, E. K. Murliev, D. K. Palchaev, M. K. Rabadanov, I. M. Abdulagatov, Russian Microelec. 47 (2), 118-130 (2018).
[4] H-Y. Shih, W-H. Lee, W-C. Kao, Y-C. Chuang, R-M. Lin, H-C. Lin, M. Shiojiri, and M-J. Chen, Scientific Reports 7:39717.
[5] W-C. Kao, W-H. Lee, S-H. Yi, T-H. Shen, H-C. Lin, M-J. Chen, RSC Adv. 9, 12226-12231 (2019).
[6] W-H. Lee, Y-T. Yin, P-H. Cheng, J-J. Shyue, M. Shiojiri, H-C. Lin, and M-J. Chen, ACS Sustainable Chem. Eng. 7,1, 487-495 (2019).

Example 4

The low-temperature (<400° C.) deposition of polycrystalline AlN films is demonstrated by atomic layer annealing (ALA) which is a variant of ALD that utilizes a third pulse of ions in addition to the usual metal and co-reactant pulses [1]. As transistor size continues to decrease, it becomes a significant challenge to remove the heat generated during the operation of microelectronic circuits. The use of electrically conductive heat spreaders complicates 3D integration in VLSI CMOS or stack memory devices and induces parasitic losses in RF MMICs. Crystalline AlN has a thermal conductivity close to that of Cu and is a good electrical insulator making it an ideal heat spreader material.

Using trimethyl aluminum (TMA) and the highly reactive nitrogen-containing precursor hydrazine ($N_2H_4$), AlN can be deposited at 200° C. [2]; however, these films are amorphous and would have low thermal conductivity due to phonon scattering. Using tris(dimethylamido)aluminum (TDMAA) or tris(diethylamido)aluminum (TDEAA) with $N_2H_4$ or $NH_3$ at temperatures >350° C., polycrystalline films can be deposited in a purely thermal process; however, the reported grain sizes are small (<5 nm) or there is a mixture of polycrystalline and amorphous phases [3-4]. ALA has been used to deposit crystalline films such as AlN [1,5] and GaN [6] at low temperature, but a nitrogen-containing plasma was used.

In the present study of AlN ALA, two metal precursors (TMA and TDMAA) were compared using anhydrous $N_2H_4$ as a co-reactant and argon ions with tuned energy for the third pulse. High-quality AlN films are deposited with large grain size and low C/O contamination which can then be used as a templating layer for further high-speed AlN film growth.

The deposition of high quality, stress controlled AlN films deposited by ALA are successfully used as templates for thicker heat spreading layers deposited via sputtering and polycrystalline sputtered AlN films with near-record thermal conductivities of ~70 $Wm^{-1}K^{-1}$ were obtained for sub-0.5 micron thick films.

References, Example 4

[1] H-Y. Shih et al, Scientific Reports 7:39717.
[2] M. Mizuta et al, Japanese J. Appl. Phys. 25 (12), L945-L948 (1986).
[3] R. G. Gordon, U. Riaz, and D. M. Hoffman, J. Mater. Res., 7 (7) (1992).
[4] A. I. Abdulagatov et al Russian Microelec. 47 (2), 118-130 (2018).
[5] W-C. Kao et al, RSC Adv. 9, 12226-12231 (2019).

[6] W-H. Lee et al ACS Sustainable Chem. Eng. 7,1, 487-495 (2019).

TRIS(DIMETHYLAMIDO)ALUMINUM(III) AND $H_2N_4$: IDEAL PRECURSORS FOR DEPOSITION OF BACK END OF LINE COMPATIBLE, LARGE GRAIN, ORIENTED C-AXIS ALUMINUM NITRIDE ON SILICON VIA ATOMIC LAYER ANNEALING

Example 5

Figure 15:
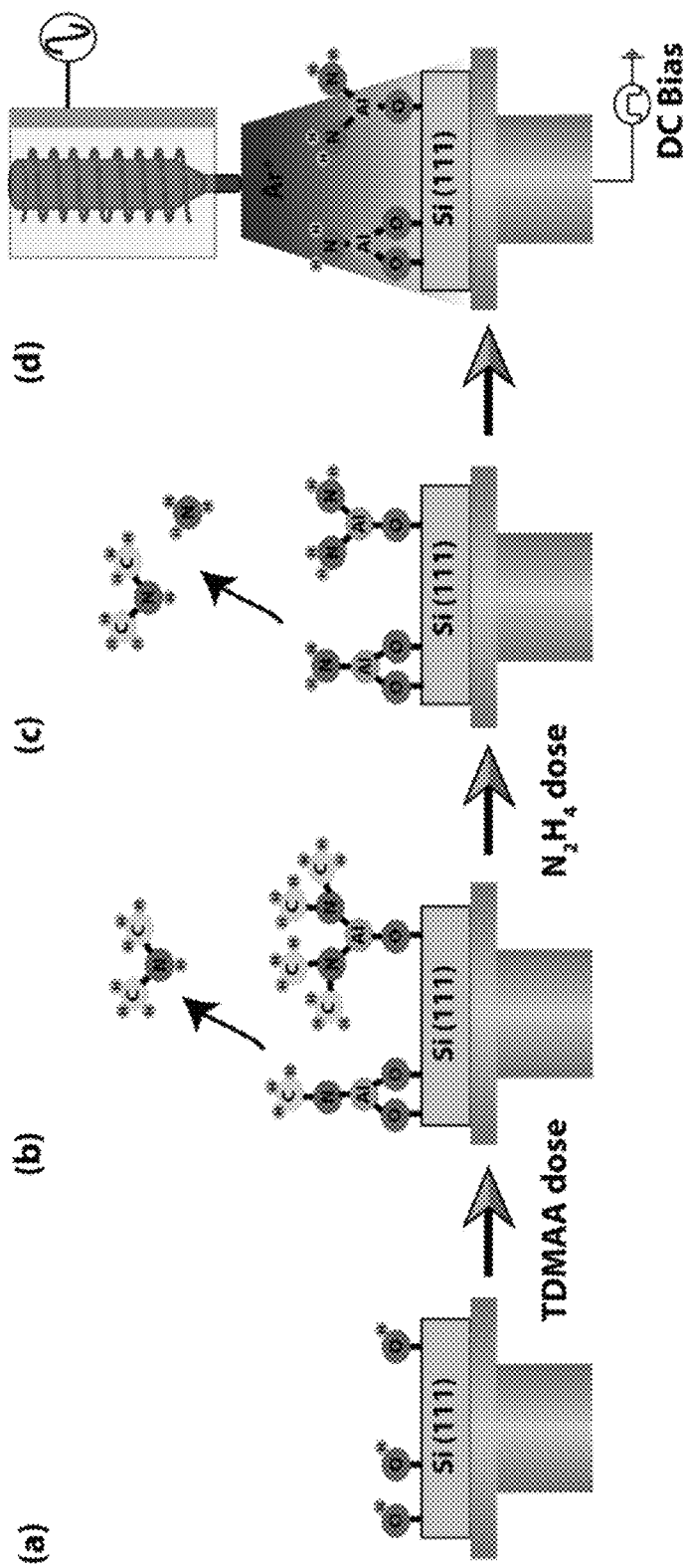
FIG. 15. Schematic Diagram of ALA AlN. (Panel a) Beginning with a hydroxyl terminated Si wafer, (panel b) the TDMAA is introduced leaving the surface terminated in aluminum dimethylamide. (Panel c) Introduction of $N_2H_4$ removes the surface bound dimethylamide as dimethylamine gas. (Panel d) The final step in the ALA process consists of low energy ion bombardment which helps to induce surface mobility and crystalize the film. This 3-step process can be repeated any number of times to achieve the desired thickness.

In this example, the low-temperature (≤400° C.) deposition of polycrystalline AlN films on Si (111) is demonstrated by atomic layer annealing (ALA) which is a variant of atomic layer deposition (ALD) that utilizes a third pulse of low-energy inert gas ions in addition to the usual metal and co-reactant pulses (See FIG. 15).24 Using this technique, the stoichiometries of the films are determined by the thermal reaction of the metal and co-reactant while the crystallinity is controlled by the plasma treatment with a non-reactive gas.

Using trimethyl aluminum (TMA) or tris(dimethylamido) aluminum (TDMAA) with the highly reactive nitrogen-containing precursor hydrazine ($N_2H_4$), AlN can be deposited at ~200° C.;[25,26] however, these films are amorphous. Using TDMAA with $N_2H_4$ or $NH_3$ at temperatures ≥350° C., polycrystalline films can be deposited in a purely thermal process; however, the reported grain sizes are small (<5 nm) or there is a mixture of polycrystalline and amorphous phases. 27.28 ALA has been used to deposit crystalline films such as AlN[25,29] and GaN[30] on a near lattice-matched substrate (sapphire) at low temperatures, but a $N_2/H_2$ plasma was used and the effects of substrate biasing were not explored.

In the present example of AlN ALA on Si (111) (a non-lattice matched substrate), two metal precursors (TMA and TDMAA) were compared using ultra-high purity anhydrous $N_2H_4$ as a co-reactant and argon ions with tuned energy for the third pulse. It was found that ALA deposition using TDMAA as the Al precursor resulted in high-quality AlN films with large grain size (>9 nm) and low C/O contamination (<2 at %) whereas films deposited using TMA had much higher carbon content (>5%), owing to its thermal instability at 400° C. Transmission electron micrographs for a 10 nm ALA AlN film grown using TDMAA and $N_2H_4$ show vertical grain structure with grains spanning the entire thickness of the film. As heat spreading layers often need to be in excess of >250 nm thick in order to be relevant for use in high volume manufacturing, it was also demonstrated that ALA-deposited films successfully enhance the grain size of a thick sputtered AlN film by acting as a template layer.

Methods

Materials. Si (111) substrate wafers (Phosphorous, n-type) with a resistivity of 1-20 ohm-cm were purchased from Waferworld. Acetone (99.5+%), methanol (99.5+%), and deionized (DI) water (99.5%+) were purchased from Fisher Scientific. Hydrofluoric (HF) acid (48%) was purchased from VWR and diluted down to 2% with DI water before use. Ar (99.999%) was purchased from Praxair and purified using an Entegris Gatekeeper gas purifier before being used as both the plasma gas as well as the precursor carrier gas. TMA (98+%) was purchased from Strem chemicals. TDMAA was supplied by EMD performance materials. BRUTE anhydrous hydrazine was supplied by Rasirc, Inc.

Sample preparation. Si samples were first degreased using 10 s rinses in acetone, methanol, and DI water. Following the degrease, native oxides were removed via a cyclic HF clean consisting of 1 min immersions in HF and DI water for 2.5 cycles. Immediately following the clean, the samples were loaded onto a sample holder and pumped down to a pressure of <2× 10-6 Torr before loading into the deposition chamber.

Figure 23:
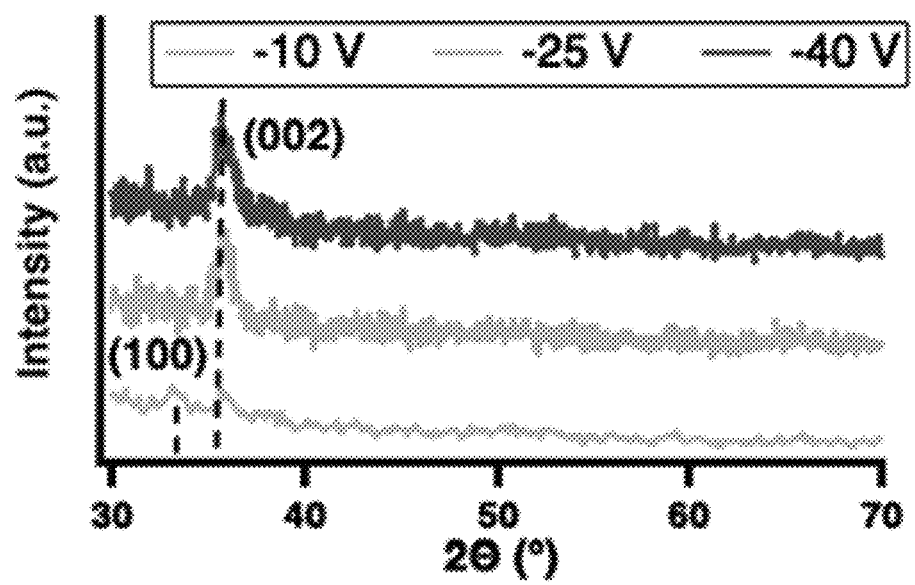
FIG. 23. GIXRD diffractograms for different DC biases during ALA. XR diffractograms show that at low DC bias (−10 V), films are mixed phase (100) and (002), while at slightly higher bias (−25 V), the films are oriented (002).

AlN deposition. The ALA deposition was conducted in a home-built chamber (wall temp=90° C.) with a base pressure <1×10$^{-6}$ Torr and consisted of a home-built reactor pumped by a dry pump (Edwards EPX 500NE) protected by a liquid nitrogen cold trap and stainless steel mesh particle trap (See FIG. 1). The stage allows for sample biasing and consists of an electrically isolated copper block heated by a cartridge heater. Dosing was performed using pneumatically actuated diaphragm valves with pulse times optimized for growth rates of ~0.9 Å/cycle. TDMAA was dosed using a bottle temperature of 105° C. while all other precursors were kept at room temperature. Gas flows were controlled by mass flow controllers and fed into a RF remote plasma source (PIE Scientific) with a quartz plasma tube mounted above the chamber. ALA used a 20 s treatment each cycle using Ar gas at a pressure of 5 mTorr at a power of 75 W with a pulsed stage bias of –25 VDC (See bias optimization, FIG. 23). For bilayer samples (ALA AlN+sputtered AlN), following ALA deposition, samples were transported in vacuo to an attached sputter chamber (based pressure ~2×10$^{-6}$ Torr) where AlN was deposited using a Torus Magkeeper sputter cathode (Kurt Lesker) using a 2 inch diameter Al target and 100% $N_2$ gas at a pressure of 3 mTorr and 300 W of RF power. Amorphous AlN layers were deposited under similar sputtering conditions but at a pressure of 30 mTorr.

X-ray photoelectron spectroscopy (XPS). Samples were transferred from the deposition chamber to the UHV analysis (Omicron VT, base pressure 5×10$^{-9}$ Torr) chamber in vacuo. XP spectra were acquired using a Mg Kα source (hv=1253.6 eV) and DESA 150 electron analyzer (Staib Instruments) at a collection angle of 45° relative to the surface normal using a step width of 0.1 eV. Analysis of the XPS data was performed in CasaXPS v2.3 using Shirley background subtraction and Schofield photoionization cross sectional relative sensitivity factors.

Structural Analysis. Ex situ grazing incidence x-ray diffractometry (GIXRD) and x-ray reflectometry (XRR) were carried out on a diffractometer (Smartlab, Rigaku) using a Cu Kα source (λ=0.154 nm) operating at 40 kV. Simulation and fitting of the XRR data were carried out using the Smartlab Studio software suite (Rigaku). Cross-sectional transmission electron microscopy (TEM) was used to evaluate the fine grain structure of the deposited films and was performed at Applied Materials.

Results and Discussion

Figure 16:
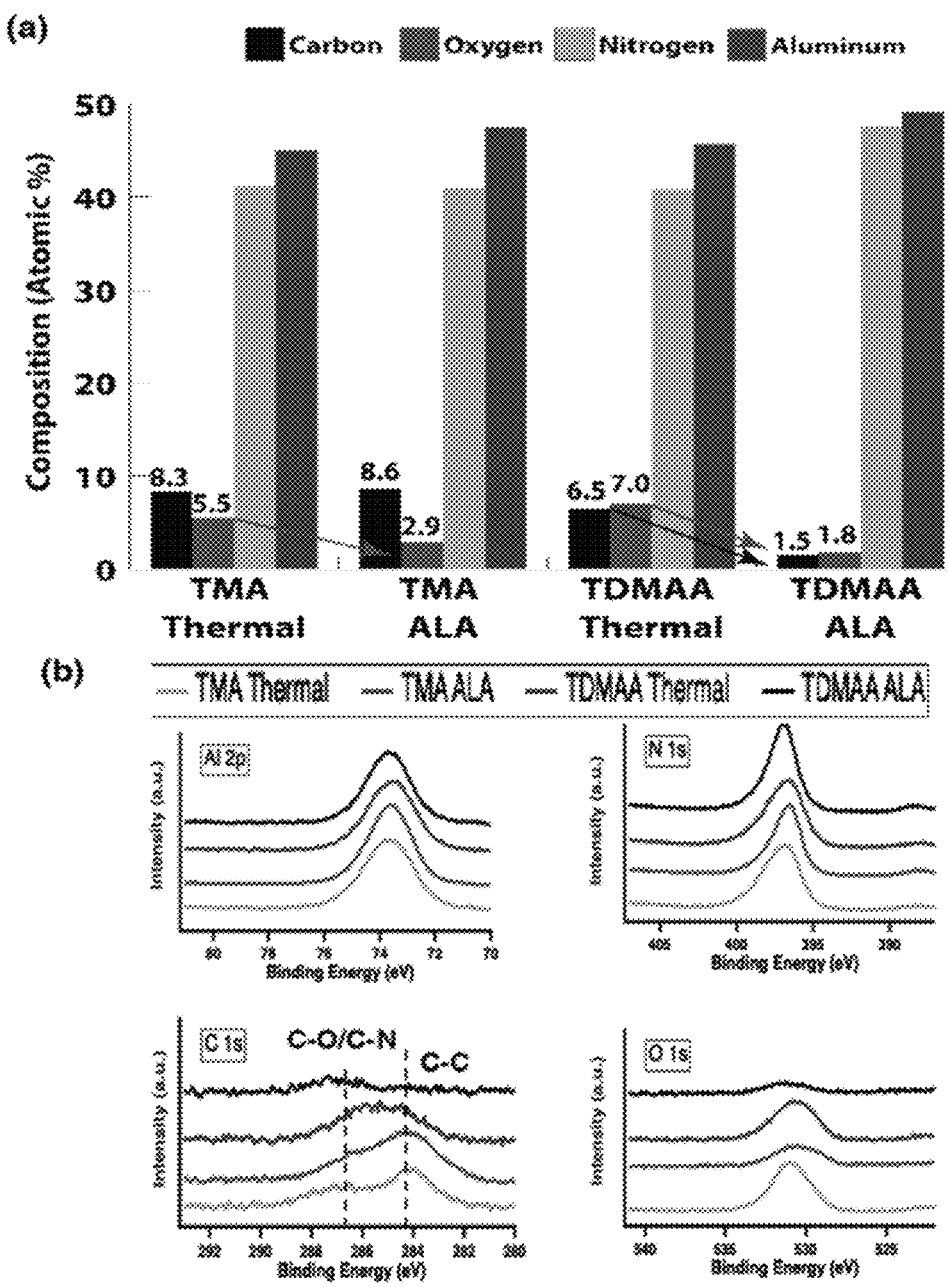
FIG. 16. XPS Chemical Composition Data for both Thermal and ALA Processes using TDMAA and TMA at 225° C. (Panel a) The chemical compositions for the thermal process using TMA or TDMAA are very similar, with the ALA process resulting in the removal of unwanted C/O, especially when using TDMAA. (Panel b) High resolution XP spectra show chemical shift consistent with AlN formation and the effect of ALA on the C/O contamination.

Two Al precursors (TMA and TDMAA) were first benchmarked at 225° C. Using a purely thermal process, sequential doses of either 400 ms TMA and 2×100 ms pulses of $N_2H_4$ with 5 s purge times or 2×300 ms TDMAA with a 4 s purge and 100 ms $N_2H_4$ with an 8 s purge were used. For ALA samples, each cycle also included a 20 s Ar plasma treatment with the stage biased at –25 VDC. This cyclic process was repeated in order to deposit films ~40 nm in thickness. As can be seen in FIG. 16, the thermal process for both TDMAA and TMA results in films of similar purity; however, the ALA process removes much more carbonaceous contamination in the case of TDMAA, possibly due to the lack of any direct Al—C bonding in TDMAA. Chemical shift data collected from high resolution XPS spectra are consistent with the formation of AlN and also demonstrate the beneficial effect of ALA on C/O contamination in these films.

Figure 17:
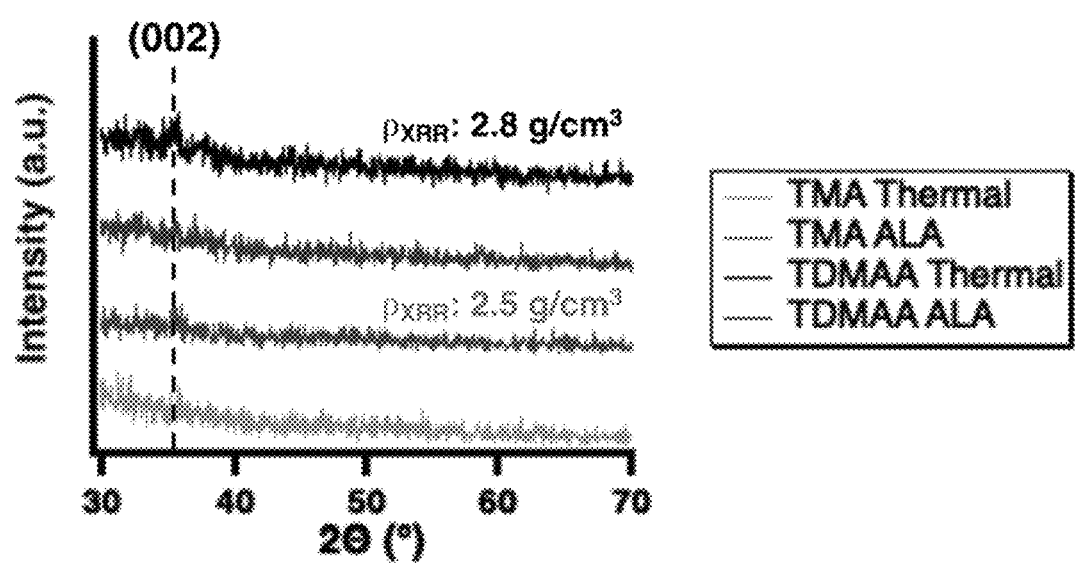
FIG. 17. XRD Data for both Thermal and ALA Processes using TDMAA and TMA at 225° C. The deposited films are either amorphous or nanocrystalline. Note that even when small crystalline peaks are observed for the ALA process, density via XRR is much lower than bulk crystalline AlN.

Structural analysis of these films via XRD show that all samples had at best marginal crystallinity regardless of process (FIG. 17). Though small XRD peaks corresponding to AlN (002) were observed for the ALA process, the density of these films as measured by XRR was found to be 2.5 and 2.8 g/cm3 for the TMA ALA and TDMAA sample, respectively, which is >15% lower than the bulk value for crystalline AlN and likely indicates large percentages of the films are amorphous. Previous studies on PEALD deposited AlN also note that at lower temperatures, crystallization of the film does not occur at T<300° C. and that either higher deposition temperature or increased plasma power were needed to form crystalline films[17].

Figure 18:
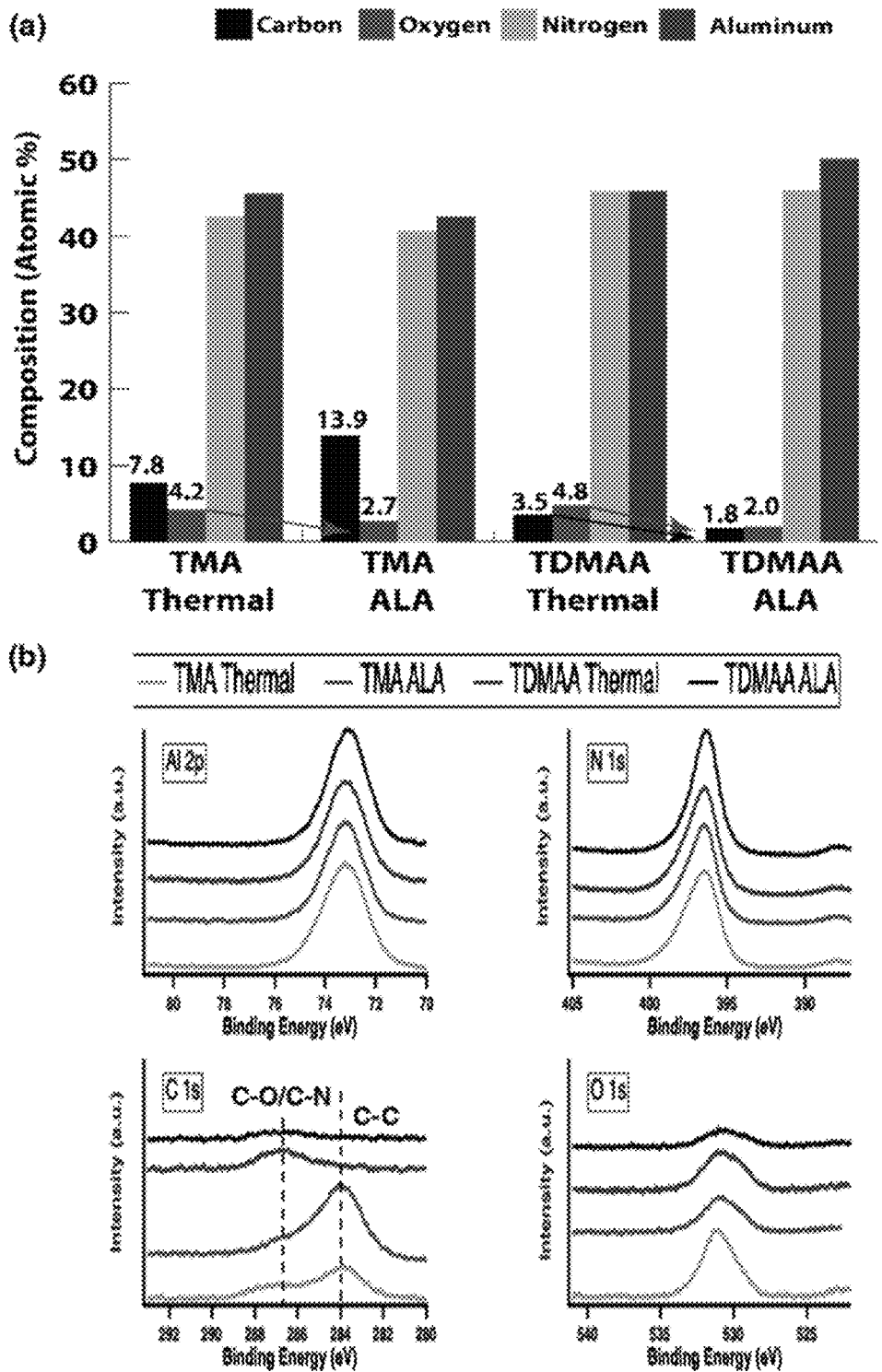
FIG. 18. XPS Chemical Composition Data for both Thermal and ALA Processes using TDMAA and TMA at 400° C. (Panel a) At 400° C. substrate temperature, films grown using TDMAA have lower impurity content, with the ALA films containing the lowest impurity content of <2% C/O. (Panel b) High resolution XP spectra show chemical shift consistent with AlN formation and the effect of ALA on the C/O contamination.

The same two precursors were compared at 400° C. deposition temperature. Owing to the improved reactivities of the precursors at 400° C., precursor pulses were modified to 35 ms TMA with a 10 s purge and 100 ms $N_2H_4$ with an 8 s purge or 150 ms TDMAA with a 4 s purge and 100 ms $N_2H_4$ with an 8 s purge. ALA samples received the same 20 s Ar plasma treatment with the stage biased at –25 VDC used previously. Due to the thermal decomposition of TMA at 400° C.[31,32], the lowest growth rate attainable was 1.8 Å/cycle. As it can be seen in FIG. 18, films grown using TDMAA have lower impurity concentration for both the thermal as well as ALA process. It is noted that at 400° C. using TMA, the ALA process actually increases the carbon content in the AlN films. This is likely linked to the thermal instability of TMA at high temperatures which may result in the generation of carbon-containing species such as gaseous methyl radicals that the plasma then imbeds in the AlN films. In contrast, because TDMAA does not contain any C—Al bonds and has high thermally stability at 400° C., the resulting AlN films do not contain high levels of carbon[33,34]. From the high-resolution carbon XP spectra (FIG. 18, panel b), it is seen that for the TDMAA ALA process, aliphatic carbon is reduced to below detection limits while the remaining component just above detection limits is likely surface bound dimethylamide. Especially noteworthy is the ALA process with TDMAA achieves extremely low impurity concentration (<2% C/O) even without sputtering into the bulk of the film.

Figure 19:
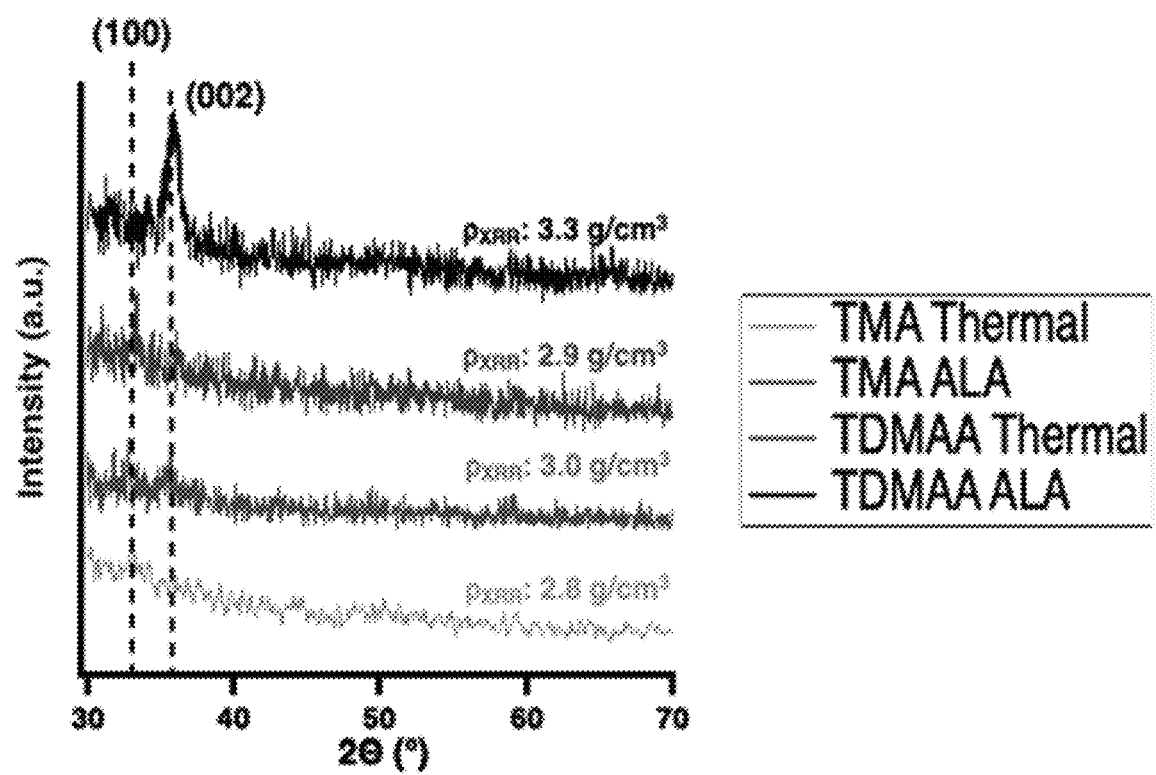
FIG. 19. XRD Data for both Thermal and ALA Processes using TDMAA and TMA at 400° C. Films grown using TDMAA ALA display oriented (002) growth as compared to the other processes which are predominantly (100) oriented, mixed phase, or amorphous. Note bulk-like AlN density is only achieved for TDMAA ALA.

Subsequent XRD analysis (FIG. 19) confirms that the TDMAA ALA process leads to the highest quality films of oriented c-axis AlN. The film densities of the ALA samples were measured by XRR to be 3.0 g/cm$^3$ and 3.3 g/cm$^3$ for the TMA ALA and TDMAA sample, respectively which indicates that the elevated carbon content in the TMA ALA sample likely prevented crystallization while the TDMAA ALA sample has a density within 1% of bulk crystalline AlN. (FWHM) of 0.95°, which corresponds to a crystallite size of ~9.2 nm by the Scherer equation[35].

Figure 20:
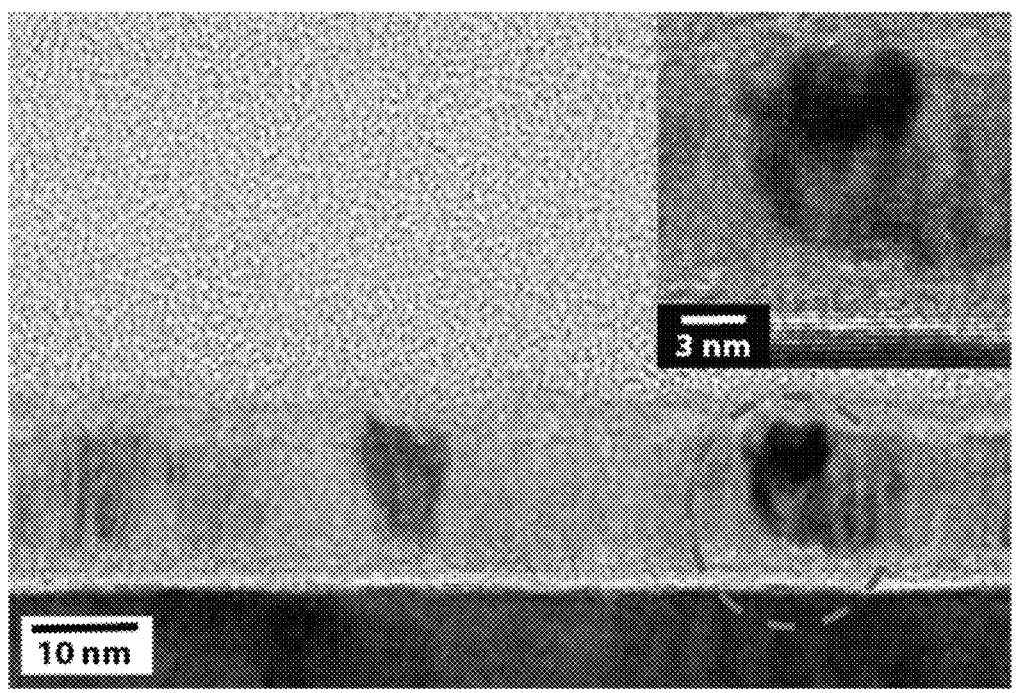
FIG. 20. Bright Field TEM Image of a 10 nm ALA AlN layer. Template layers are smooth by TEM and have large grains that extend through the entire thickness of the film (inset: high resolution TEM showing the lattice fringes).

In order to demonstrate the effect of these ALA-deposited layers, sputter deposition was identified as one method capable of quickly depositing crystalline AlN at temperatures compatible with BEOL processing. Sputter-deposited AlN films can contain large amounts of compressive strain[36] when deposited on Si (111) and so it is necessary to use a buffer layer in order to avoid cracking or flaking of the deposited film. Thin, 25 nm ALA AlN films grown using TDMAA were subsequently deposited for use as templates for the growth of 290 nm of sputter deposited AlN and compared against a buffer layer composed of 25 nm of amorphous AlN. As it can be seen in FIG. 20, the template layers deposited via ALA on a non-lattice-matched substrate Si (111) are smooth and contain grains >10 nm wide that span the entire thickness of the film.

Figure 21:
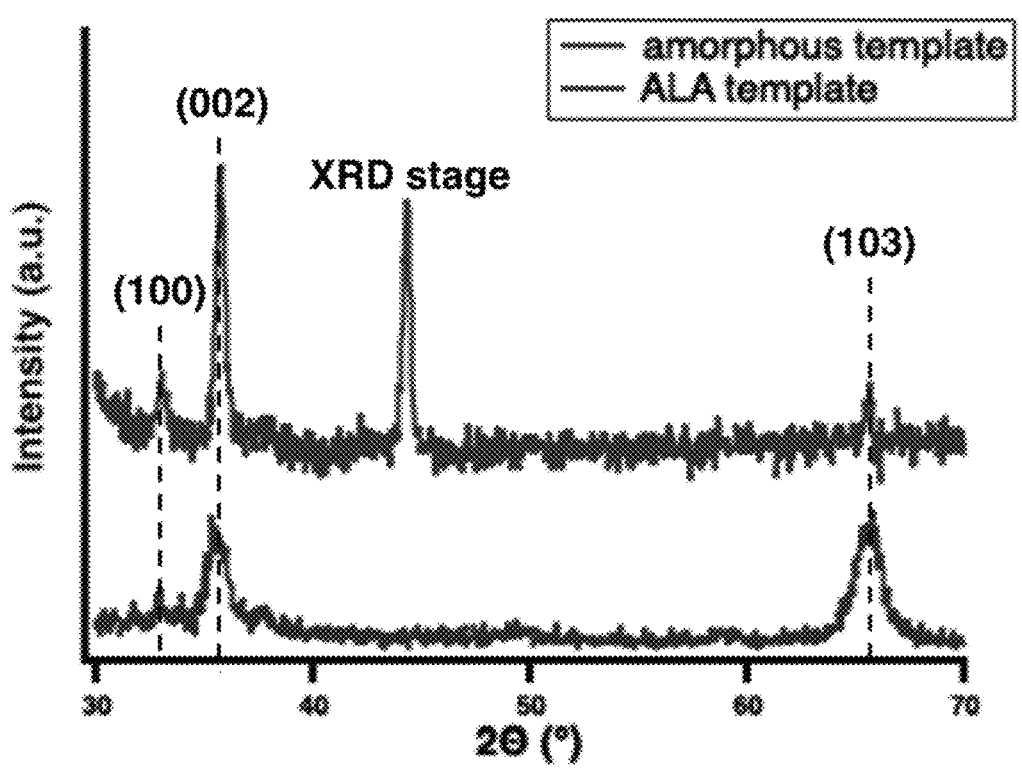
FIG. 21. XRD data comparing AlN films using a 25 nm amorphous AlN buffer layer with a 25 nm ALA AlN buffer layer. Replacing the amorphous AlN buffer layer with ALA AlN results in 2.5× improvement in grain size for equivalent thickness of sputtered material.
Figure 22:
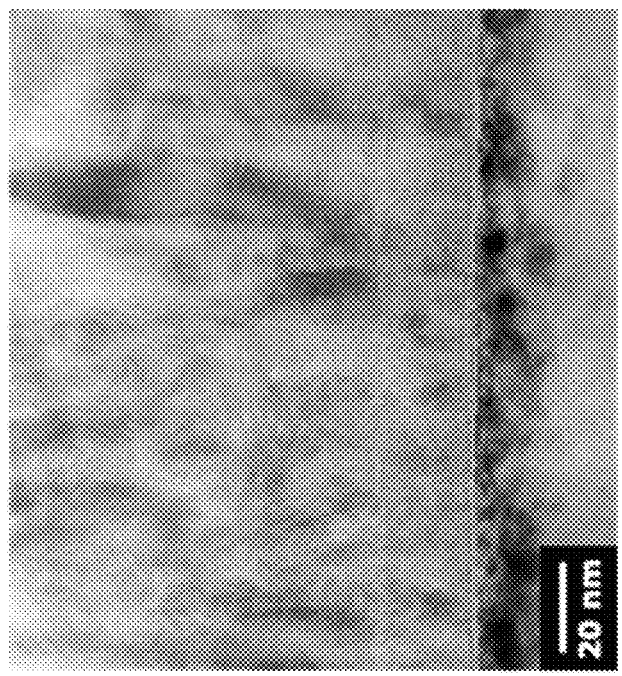
FIG. 22. Bright Field TEM Image of a 25 nm ALA AlN templating the growth of 290 nm sputtered AlN. (Panel a) Columnar grains are observed that extend from the top of the film to the substrate. (Panel b) The sputtered grain structure originates from the template layer and then grow vertically.
Figure 22:
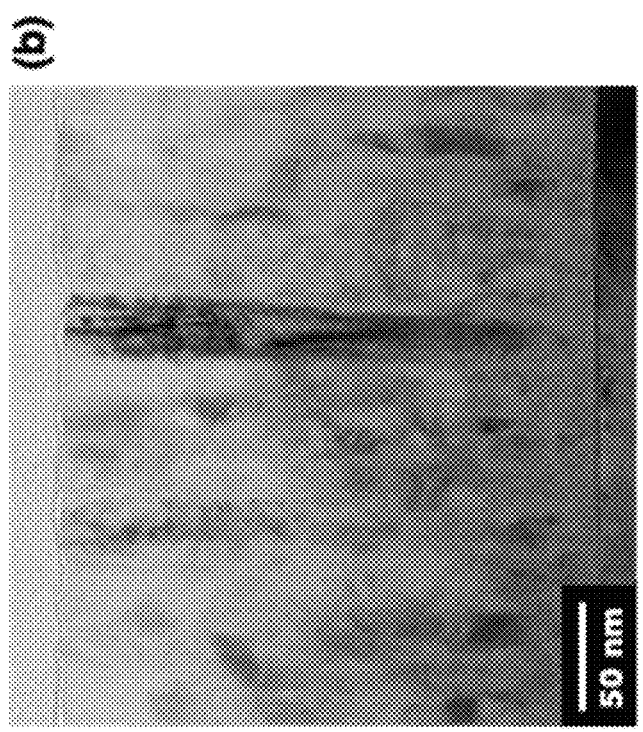

The initial growth stages of sputtering are an essentially stochastic process when performed on a non-lattice matched substrate. This results in multiple grain orientations or the formation of dislocations/defects that reduce the average grain size of the sputtered material. Due to the ALA template acting as a lattice matched substrate, it was expected that sputtered films grown on the ALA layers would have larger average grain size with and have stronger (002) preferential orientation as compared to the amorphous AlN buffer layers. As it can be seen in FIG. 21, XRD data show that sputtered AlN grown on amorphous AlN is polycrystalline (002)/(103) with no preferential orientation while the AlN grown on the ALA AlN template is highly textured (002). TEM data of the sample grown on ALA AlN (FIG. 22) show the grain structure of the sputtered layer originating from the ALA layer which then serves to template the columnar growth of the film. When comparing the FWHM of the (002) peak, the sample grown on amorphous AlN has a much larger FWHM (1.09° as compared to the sample grown on ALA AlN) (0.45° which corresponds to an increase in average grain size from 8 nm to 19.4 nm by using the ALA template layer.

Bias Optimization Study for TDMAA/N$_2$H$_4$ ALA at 400° C.

DC bias is a simple method that can tune ion energy while minimizing changes to the plasma properties[37]. As it can be seen in FIG. 23, controlling DC bias during the ALA process allows for control over film structure. While the thermal process results in weakly (100) oriented films, at −10 VDC the films become mixed phase and at higher bias setpoints, the films become oriented (002). −25 VDC was chosen for the ALA study due to the slightly lower (002) FWHM of 0.95° compared to 1.12° at −40 VDC.

CONCLUSION

In summary, it is demonstrated that precursor selection is key for developing processes for the low temperature deposition of oriented crystalline materials on non-lattice matched substrates such as Si (111). It is shown that even at the relatively modest temperature of 400° C., commonly used precursors such as TMA do not possess the thermal stability needed in order to deposit high quality crystalline films and that there exists a need for non-intuitive precursors such as TDMAA and N$_2$H$_4$. Through the selection of precursors that are thermally stable, yet highly reactive, oriented c-axis AlN films are able to be grown on Si via bias enhanced ALA. These films have an average grain size >9 nm and are successfully shown to template the growth of sputtered AlN which results in a 2× increase in the average grain size (19 nm) as compared to an AlN film sputtered on amorphous AlN (8 nm). As this process does not require a lattice matched substrate and is BEOL compatible, it is relevant for a wide range of applications ranging from buffer layer deposition to CMOS/RF heat spreaders.

References, Example 5

(1) Xu, R. L.; Munoz Rojo, M.; Islam, S. M.; Sood, A.; Vareskic, B.; Katre, A.; Mingo, N.; Goodson, K. E.; Xing, H. G.; Jena, D.; et al. Thermal Conductivity of Crystalline AlN and the Influence of Atomic-Scale Defects. *J. Appl. Phys.* 2019. doi.org/10.1063/1.5097172.

(2) Heo, Y. J.; Kim, H. T.; Kim, K. J.; Nahm, S.; Yoon, Y. J.; Kim, J. Enhanced Heat Transfer by Room Temperature Deposition of AlN Film on Aluminum for a Light Emitting Diode Package. In *Applied Thermal Engineering*; 2013. doi.org/10.1016/j.applthermaleng.2012.07.024.

(3) La Spina, L.; Iborra, E.; Schellevis, H.; Clement, M.; Olivares, J.; Nanver, L. K. Aluminum Nitride for Heat-spreading in RF IC's. *Solid. State. Electron.* 2008. doi.org/10.1016/j.sse.2008.04.009.

(4) Lu, H.; Schaff, W. J.; Hwang, J.; Wu, H.; Koley, G.; Eastman, L. F. Effect of an AlN Buffer Layer on the Epitaxial Growth of InN by Molecular-Beam Epitaxy. *Appl. Phys. Lett.* 2001. doi.org/10.1063/1.1402649.

(5) Ponce, F. A.; Major, J. S.; Plano, W. E.; Welch, D. F. Crystalline Structure of AlGaN Epitaxy on Sapphire Using AlN Buffer Layers. *Appl. Phys. Lett.* 1994. doi.org/10.1063/1.112724.

(6) Amano, H.; Akasaki, I.; Hiramatsu, K.; Koide, N.; Sawaki, N. Effects of the Buffer Layer in Metalorganic Vapour Phase Epitaxy of GaN on Sapphire Substrate. *Thin Solid Films* 1988. doi.org/10.1016/0040-6090 (88) 90458-0.

(7) Kuznia, J. N.; Khan, M. A.; Olson, D. T.; Kaplan, R.; Freitas, J. Influence of Buffer Layers on the Deposition of High Quality Single Crystal GaN over Sapphire Substrates. *J. Appl. Phys.* 1993. doi.org/10.1063/1.354069.

(8) Shiino, T.; Shiba, S.; Sakai, N.; Yamakura, T.; Jiang, L.; Uzawa, Y.; Maezawa, H.; Yamamoto, S. Improvement of the Critical Temperature of Superconducting NbTiN and NbN Thin Films Using the AlN Buffer Layer. *Supercond. Sci. Technol.* 2010. doi.org/10.1088/0953-2048/23/4/045004.

(9) Chen, Y.; Song, H.; Li, D.; Sun, X.; Jiang, H.; Li, Z.; Miao, G.; Zhang, Z.; Zhou, Y. Influence of the Growth Temperature of AlN Nucleation Layer on AlN Template Grown by High-Temperature MOCVD. *Mater. Lett.* 2014. doi.org/10.1016/j.matlet.2013.09.096.

(10) Kakanakova-Georgieva, A.; Nilsson, D.; Janzén, E. High-Quality AlN Layers Grown by Hot-Wall MOCVD at Reduced Temperatures. *J. Cryst. Growth* 2012. doi.org/10.1016/j.jcrysgro.2011.10.052.

(11) Van Bui, H.; Wiggers, F. B.; Gupta, A.; Nguyen, M. D.; Aarnink, A. A. I.; de Jong, M. P.; Kovalgin, A. Y. Initial Growth, Refractive Index, and Crystallinity of Thermal and Plasma-Enhanced Atomic Layer Deposition AlN Films. *J. Vac. Sci. Technol. A Vacuum, Surfaces, Film.* 2015. doi.org/10.1116/1.4898434.

(12) Sippola, P.; Pyymaki Perros, A.; Ylivaara, O. M. E.; Ronkainen, H.; Julin, J.; Liu, X.; Sajavaara, T.; Etula, J.; Lipsanen, H.; Puurunen, R. L. Comparison of Mechanical Properties and Composition of Magnetron Sputter and Plasma Enhanced Atomic Layer Deposition Aluminum Nitride Films. *J. Vac. Sci. Technol. A* 2018. doi.org/10.1116/1.5038856.

(13) Banerjee, S.; Aarnink, A. A. I.; van de Kruijs, R.; Kovalgin, A. Y.; Schmitz, J. PEALD AlN: Controlling Growth and Film Crystallinity. *Phys. Status Solidi Curr. Top. Solid State Phys.* 2015. doi.org/10.1002/pssc.201510039.

(14) Alevli, M.; Ozgit, C.; Donmez, I.; Biyikli, N. Structural Properties of AlN Films Deposited by Plasma-Enhanced Atomic Layer Deposition at Different Growth Temperatures. *Phys. Status Solidi Appl. Mater. Sci.* 2012. doi.org/10.1002/pssa.201127430.

(15) Tarala, V.; Ambartsumov, M.; Altakhov, A.; Martens, V.; Shevchenko, M. Growing C-Axis Oriented Aluminum Nitride Films by Plasma-Enhanced Atomic Layer Deposition at Low Temperatures. *J. Cryst. Growth* 2016. doi.org/10.1016/j.jcrysgro.2016.10.015.

(16) Motamedi, P.; Cadien, K. Structural and Optical Characterization of Low-Temperature ALD Crystalline AlN. *J. Cryst. Growth* 2015. doi.org/10.1016/j.jcrysgro.2015.04.009.

(17) Bosund, M.; Sajavaara, T.; Laitinen, M.; Huhtio, T.; Putkonen, M.; Airaksinen, V. M.; Lipsanen, H. Properties of AlN Grown by Plasma Enhanced Atomic Layer Deposition. *Appl. Surf. Sci.* 2011. doi.org/10.1016/j.apsusc.2011.04.037.

(18) Liu, S.; Peng, M.; Hou, C.; He, Y.; Li, M.; Zheng, X. PEALD-Grown Crystalline AlN Films on Si (100) with Sharp Interface and Good Uniformity. *Nanoscale Res. Lett.* 2017. doi.org/10.1186/s11671-017-2049-1.

(19) Wang, J.; Maier, R. L.; Schreiber, H. Crystal Phase Transition of HfO2 Films Evaporated by Plasma-Ion-Assisted Deposition. *Appl. Opt.* 2008. doi.org/10.1364/AO.47.00C189.

(20) Park, J.-S.; Park, H.-S.; Kang, S.-W. Plasma-Enhanced Atomic Layer Deposition of Ta—N Thin Films. *J. Electrochem. Soc.* 2002. doi.org/10.1149/1.1423642.

(21) Profijt, H. B.; Van De Sanden, M. C. M.; Kessels, W. M. M. Substrate Biasing during Plasma-Assisted ALD for Crystalline Phase-Control of TiO 2 Thin Films. *Electrochem. Solid-State Lett.* 2012. doi.org/10.1149/2.024202esl.

(22) Profijt, H. B.; van de Sanden, M. C. M.; Kessels, W. M. M. Substrate-Biasing during Plasma-Assisted Atomic Layer Deposition to Tailor Metal-Oxide Thin Film Growth. *J. Vac. Sci. Technol. A Vacuum, Surfaces, Film.* 2013. doi.org/10.1116/1.4756906.

(23) Faraz, T.; Knoops, H. C. M.; Verheijen, M. A.; Van Helvoirt, C. A. A.; Karwal, S.; Sharma, A.; Beladiya, V.; Szeghalmi, A.; Hausmann, D. M.; Henri, J.; et al. Tuning Material Properties of Oxides and Nitrides by Substrate Biasing during Plasma-Enhanced Atomic Layer Deposition on Planar and 3D Substrate Topographies. *ACS Appl. Mater. Interfaces* 2018. doi.org/10.1021/acsami.8b00183.

(24) Shih, H. Y.; Lee, W. H.; Kao, W. C.; Chuang, Y. C.; Lin, R. M.; Lin, H. C.; Shiojiri, M.; Chen, M. J. Low-Temperature Atomic Layer Epitaxy of AlN Ultrathin Films by Layer-by-Layer, in-Situ Atomic Layer Annealing. *Sci. Rep.* 2017. doi.org/10.1038/srep39717.

(25) Mizuta, M.; Fujieda, S.; Matsumoto, Y.; Kawamura, T. Low Temperature Growth of Gan and Ain on Gaas Utilizing Metalorganics and Hydrazine. *Jpn. J. Appl. Phys.* 1986. doi.org/10.1143/JJAP.25.L945.

(26) Jung, Y. C.; Hwang, S. M.; Le, D. N.; Kondusamy, A. L. N.; Mohan, J.; Kim, S. W.; Kim, J. H.; Lucero, A. T.; Ravichandran, A.; Kim, H. S.; et al. Low Temperature Thermal Atomic Layer Deposition of Aluminum Nitride Using Hydrazine as the Nitrogen Source. *Materials (Basel).* 2020. doi.org/10.3390/ma13153387.

(27) Gordon, R. G.; Riaz, U.; Hoffman, D. M. Chemical Vapor Deposition of Aluminum Nitride Thin Films. *J. Mater. Res.* 1992, 7 (7), 1679-1684. doi.org/10.1557/JMR.1992.1679.

(28) Abdulagatov, A. I.; Ramazanov, S. M.; Dallaev, R. S.; Murliev, E. K.; Palchaev, D. K.; Rabadanov, M. K.; Abdulagatov, I. M. Atomic Layer Deposition of Aluminum Nitride Using Tris(Diethylamido)Aluminum and Hydrazine or Ammonia. *Russ. Microelectron.* 2018. doi.org/10.1134/S1063739718020026.

(29) Kao, W. C.; Lee, W. H.; Yi, S. H.; Shen, T. H.; Lin, H. C.; Chen, M. J. AlN Epitaxy on SiC by Low-Temperature Atomic Layer Deposition: Via Layer-by-Layer, in Situ Atomic Layer Annealing. *RSC Adv.* 2019. doi.org/10.1039/c9ra00008a.

(30) Lee, W. H.; Yin, Y. T.; Cheng, P. H.; Shyue, J. J.; Shiojiri, M.; Lin, H. C.; Chen, M. J. Nanoscale GaN Epilayer Grown by Atomic Layer Annealing and Epitaxy at Low Temperature. *ACS Sustain. Chem. Eng.* 2019. doi.org/10.1021/acssuschemeng.8b03982.

(31) Squire, D. W. Mechanistic Studies of the Decomposition of Trimethylaluminum on Heated Surfaces. *J. Vac. Sci. Technol. B Microelectron. Nanom. Struct.* 1985. doi.org/10.1116/1.582976.

(32) Gow, T. R.; Lin, R.; Cadwell, L. A.; Lee, F.; Backman, A. L.; Masel, R. I. Decomposition of Trimethylaluminum on Si (100). *Chem. Mater.* 1989. doi.org/10.1021/cm00004a006.

(33) Abdulagatov, A. I.; Amashaev, R. R.; Ashurbekova, K. N.; Ashurbekova, K. N.; Rabadanov, M. K.; Abdulagatov, I. M. Atomic Layer Deposition of Aluminum Nitride and Oxynitride on Silicon Using Tris(Dimethylamido)Aluminum, Ammonia, and Water. *Russ. J. Gen. Chem.* 2018. doi.org/10.1134/S1070363218080236.

(34) Buttera, S. C.; Mandia, D. J.; Barry, S. T. Tris(Dimethylamido)Aluminum(III): An Overlooked Atomic Layer Deposition Precursor. *J. Vac. Sci. Technol. A Vacuum, Surfaces, Film.* 2017. doi.org/10.1116/1.4972469.

(35) Scherrer, P. Bestimmung Der Größe Und Der Inneren Struktur von Kolloidteilchen Mittels Röntgenstrahlen. *Nachrichten von der Gesellschaft der Wissenschaften zu Göttingen, Math. Klasse* 1918.

(36) Kusaka, K.; Taniguchi, D.; Hanabusa, T.; Tominaga, K. Effect of Sputtering Gas Pressure and Nitrogen Concentration on Crystal Orientation and Residual Stress in Sputtered AlN Films. *Vacuum* 2002. doi.org/10.1016/S0042-207X (02) 00168-9.

(37) Reinke, P.; Jacob, W.; Möller, W. Influence of the Ion Energy on the Growth and Structure of Thin Hydrocarbon Films. *J. Appl. Phys.* 1993. doi.org/10.1063/1.354892.

Example 6

ALA Gas Vs. Bias Comparison at Fixed Ion Flux

Figure 24:
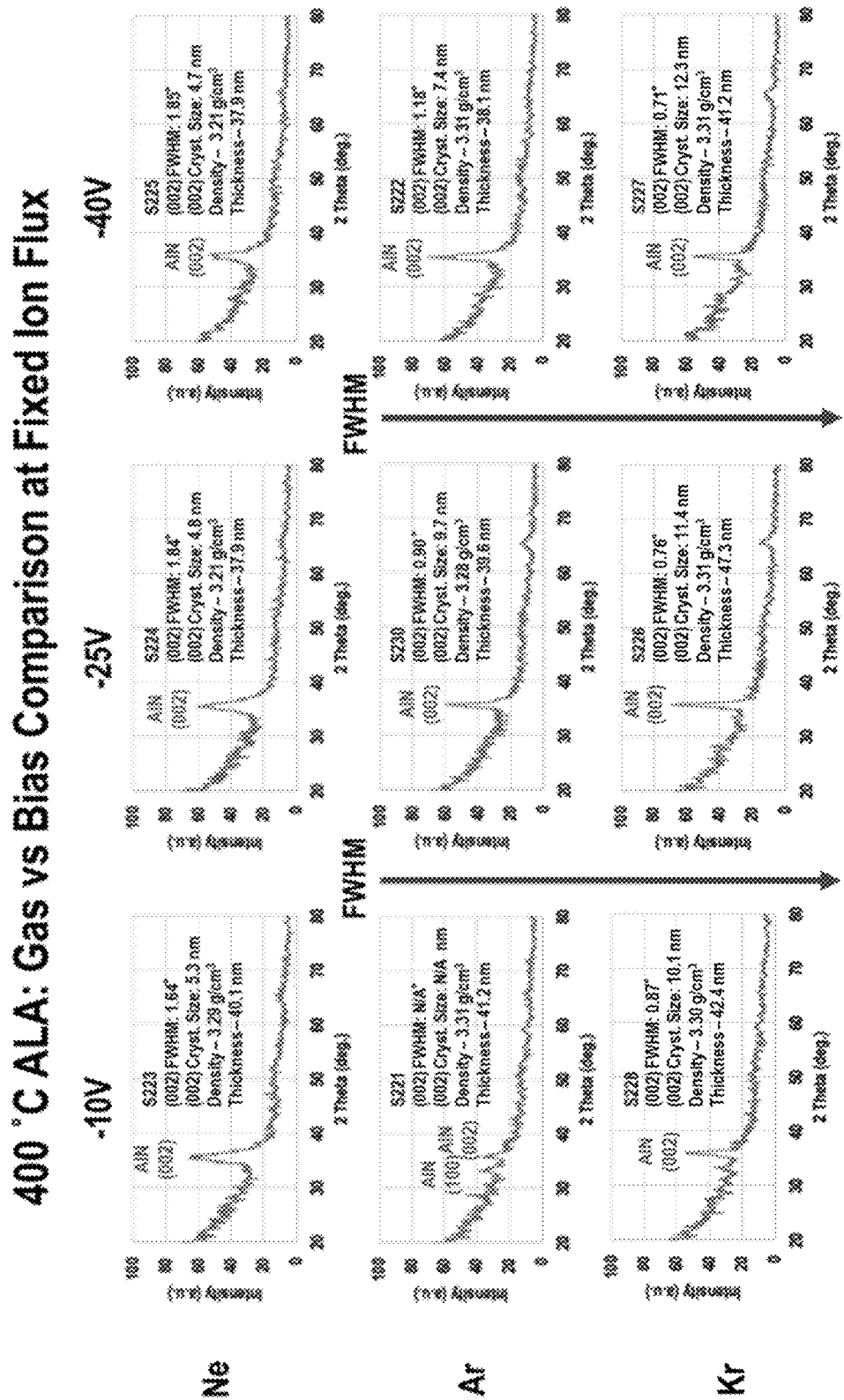
FIG. 24. Comparison of effects gas vs. bias voltage at fixed ion flux on AlN ALA. It can be noted that FHWM decreases with increasing ion momentum, corresponding to an increase in crystallite size.

Low-temperature (400° C.) deposition of polycrystalline AlN films via ALA at a fixed ion flux using various inert/noble gas plasmas at various bias voltages was examined. The results from this examination are shown in FIG. 24. The ALA processes were performed using Ne, Ar, and Kr at −20 V, −25 V, and −40 V bias voltages. All films prepared were approximately 40 nm (37.9-47.3 nm). The FWHM values listed are from detailed AlN (002) peak scans. The results observed for Ne are likely due to embedding at higher bias voltage, as seen in FWHM and XRR density exhibited. Nevertheless, it is observed that FWHM decreases, corresponding to an increase in crystallite size, with increasing ion momentum. Comparing the effect of changing bias voltage for a given gas is less clear, as RF power was altered across conditions to keep flux constant, which leads to changes in ion energy distribution.

Effect of Varying ALA Plasma Treatment Frequency on AlN Template Preparation

Figure 25:
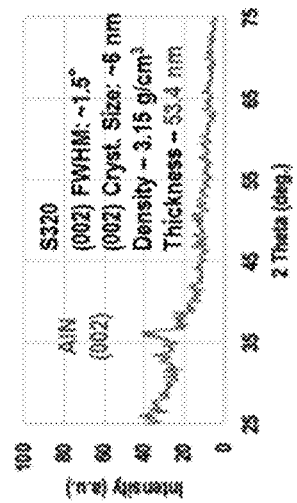
FIG. 25. Effect of varying plasma treatment frequency on AlN deposition. density and crystallite size decrease with decreasing ALA plasma treatment frequency in the deposition process.
Figure 25:
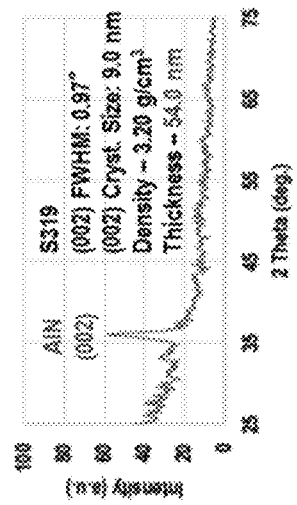
Figure 25:
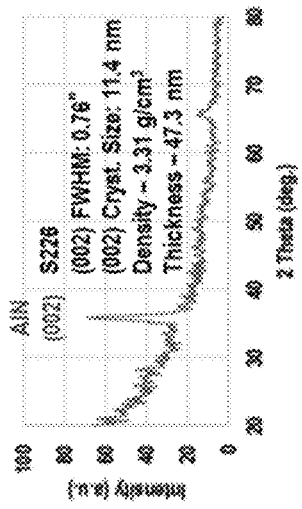

The effect of varying the frequency of plasma treatment in the deposition process was examined using Kr plasma at a bias voltage of −25 V. ALA was performed with a frequency of one plasma treatment every cycle, one plasma treatment every other cycle, and one plasma treatment every third cycle in the deposition of AlN, and the results of this examination are shown in FIG. 25. It was observed in these results that density and crystallite size in the layer deposited decrease when the ALA plasma treatment in the deposition is less frequent, and the highest density and crystallite size is achieved when an ALA plasma treatment is performed every cycle in the AlN deposition.

AlN Template Deposited by ALA (400° C.) for Rapid Growth of Sputtered AlN

Figure 26:
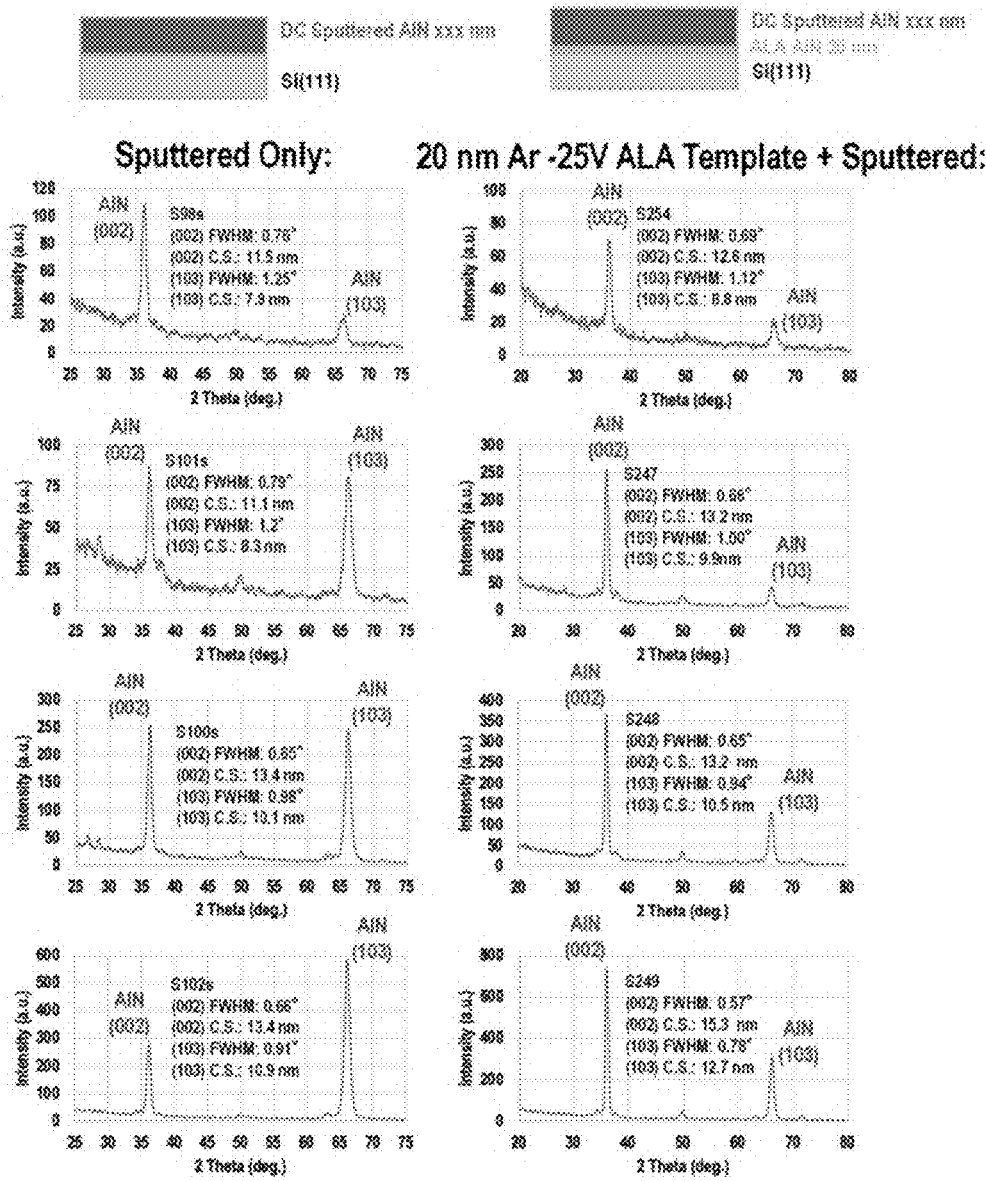
FIG. 26. Effect of a 20 nm AlN template deposited by ALA on rapid growth of sputtered AlN. Comparison of rapid growth of sputtered AlN directed on an Si (111) substrate to growth of sputtered AlN on a 20 nm thick AlN template layer deposited by ALA on Si (111).

The rapid growth of sputtered AlN (about 5.6-5.7 nm/min.) on a 20 nm AlN template deposited by ALA using an Ar plasma treatment at −25 V bias voltage was compared to sputtering only of AlN directly on HF-etched Si (111) substrates. The results are shown in FIG. 26. Rapidly grown AlN by sputtering on a 20 nm AlN template layer prepared by ALA using an Ar plasma treatment at −25 V bias voltage results in a sputtered layer having predominantly AlN (002) orientation, with slightly larger crystallite sizes compared to the sputtering only without a template layer, where significant fractions of both AlN (002) and AlN (103) orientations are observed.

Comparison of Effects of Plasma Treatment on AlN Deposition by ALA at 580° C.

Figure 27:
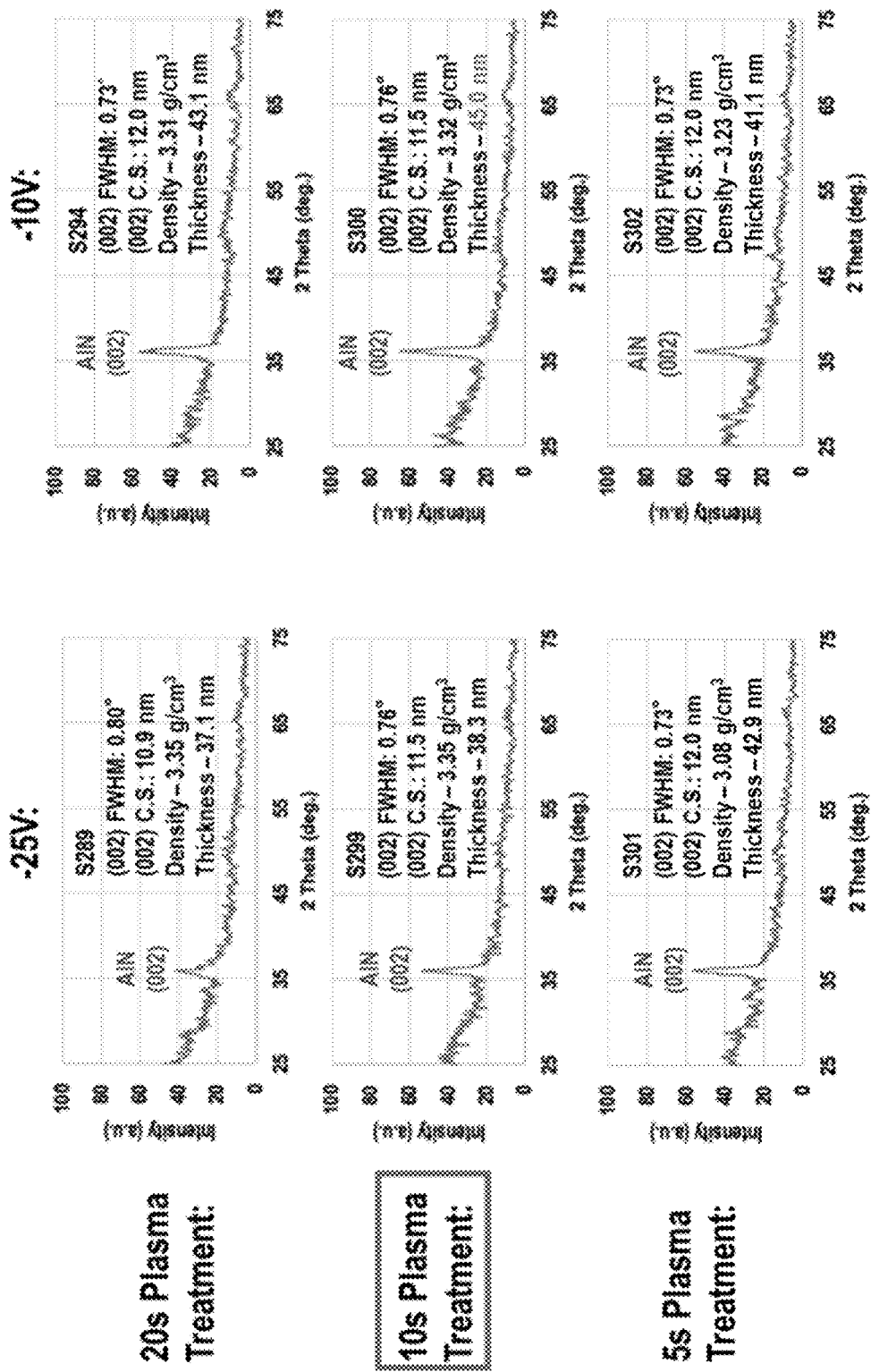
FIG. 27. Comparison of the effect of length of plasma treatment and bias voltage on ALA. AlN ALA was performed at an increased deposition temperature of 580° C., with plasma treatment for 5 s, 10 s, and 20 s, at bias voltages of −10 V and −25 V.

Deposition temperature for AlN ALA was elevated to 580° C., and the effects of duration and bias voltage on the plasma treatment using Ar were examined. Results of this examination are shown in FIG. 27. It was observed that AlN ALA at 580° C. has a wide process window for the Ar plasma treatment used. Most samples have similar crystallinity, and bulk-like density was observed in 10 s and 20 s plasma treatment times. Nevertheless, optimal conditions for ALA at 580° C. appears to be about 10 s for film crystallization and maintenance of bulk-like density when compared to ALA at 400° C. with a 20 s plasma treatment.

Optimization of 10 s Plasma Treatment for AlN Deposition by ALA at 580° C. On Si (100)

Figure 28:
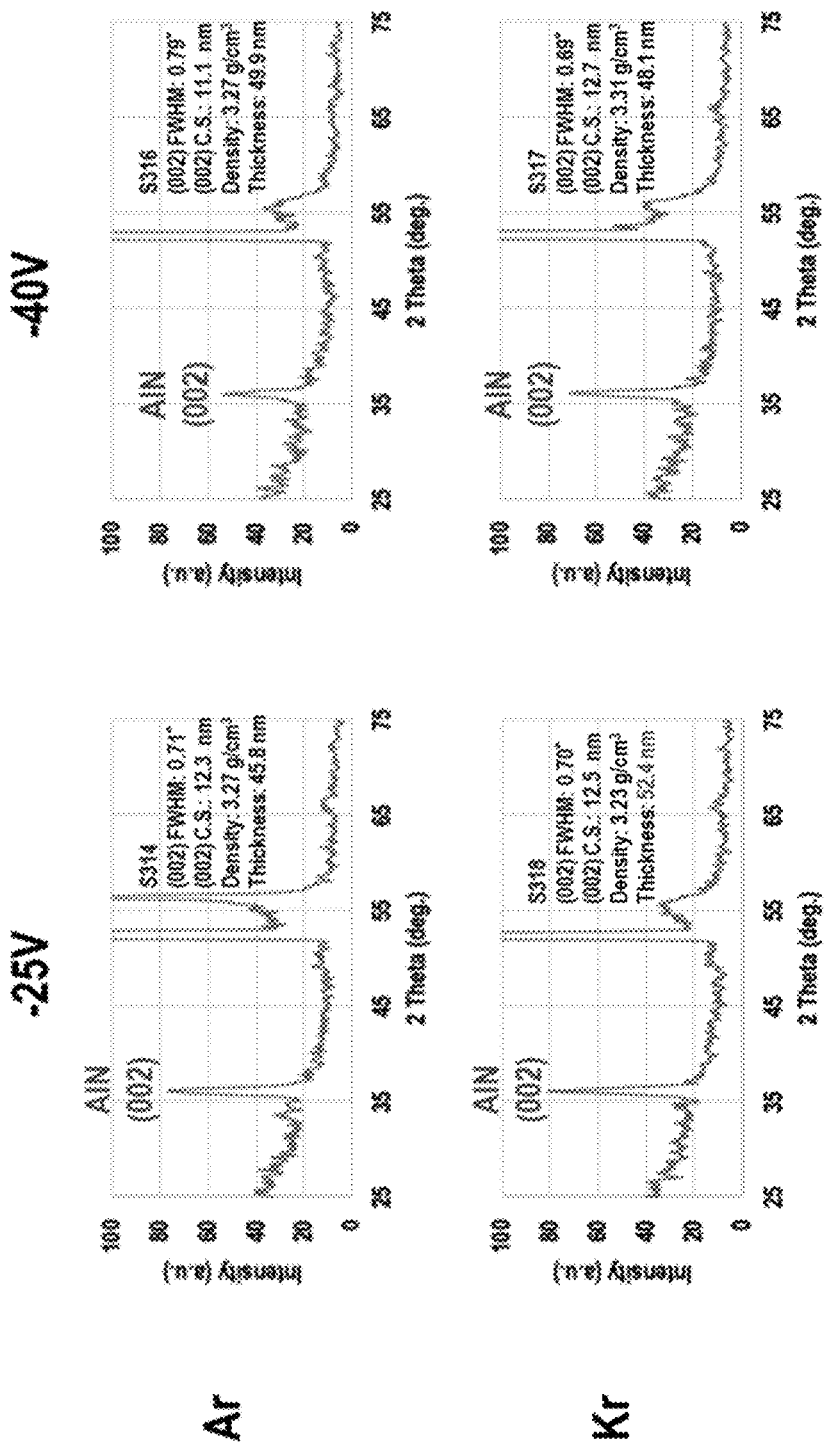
FIG. 28. AlN ALA optimization at deposition temperature of 580° C. on Si (100) with 10 s plasma treatment at −25 V and −40 V bias voltage.

The effect of choice of gas and bias voltage on AlN ALA at a 580° C. deposition temperature on HF-etched Si (100) substrates using a 10 s plasma treatment was examined, and the results are shown in FIG. 28. Again, a wide process window was observed for AlN ALA performed at 580° C. Similar crystallite sizes and near-bulk densities were observed for plasma treatment using Ar or Kr at bias voltages of −25 V and −40 V. A plasma treatment using Ar at a bias voltage of −25 V exhibited the best S/N ratio that was slightly thinner than at other conditions in the study. The decrease in crystallinity in the ALA using Ar plasma treatment at −40 V may be due to embedding.

AlN Template Deposition by ALA at 580° C. With Further AlN Growth by Pulsed CVD

Figure 29:
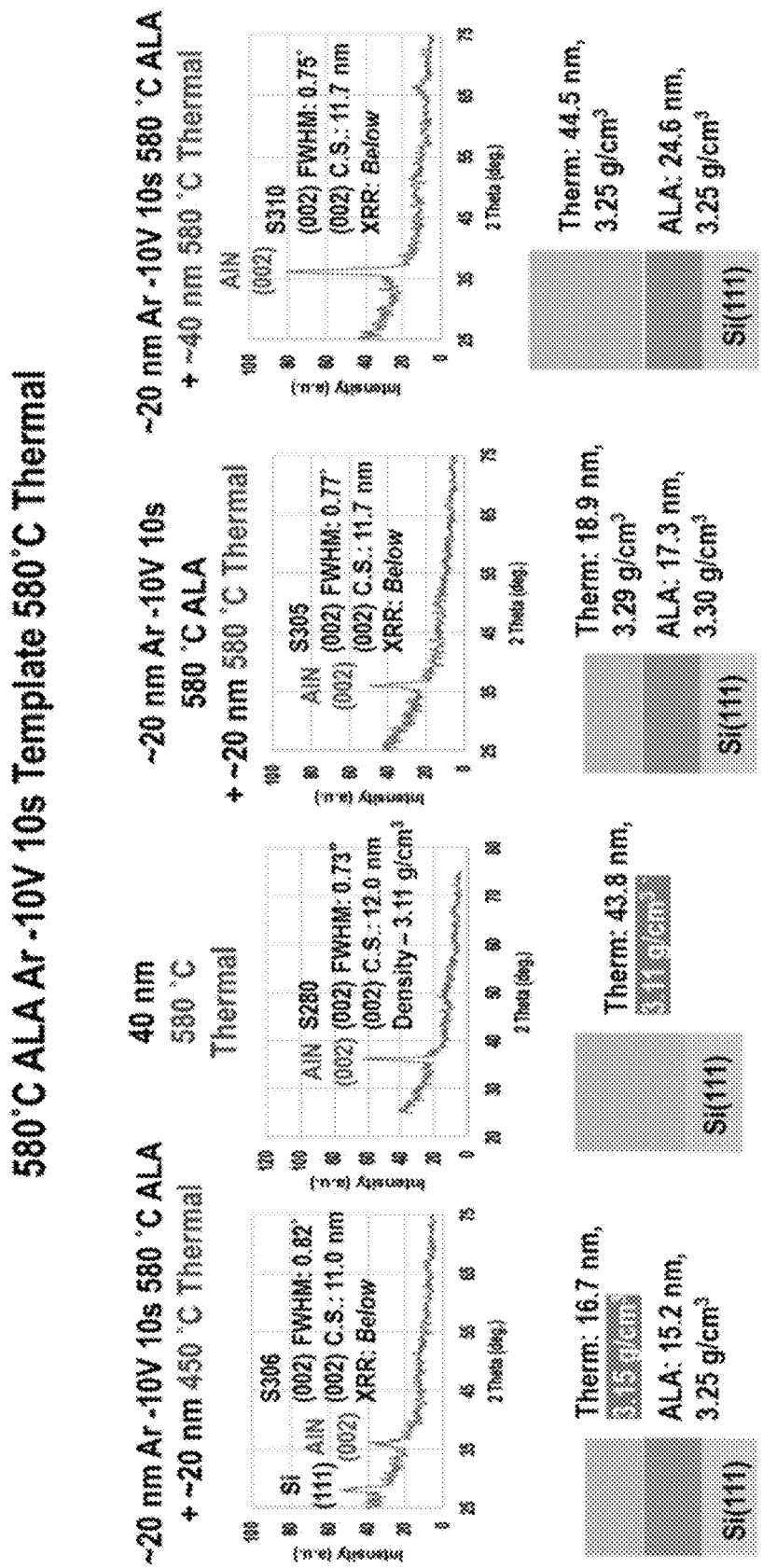
FIG. 29. Use of AlN template, prepared by 580° C. ALA with 10 s Ar plasma treatment, on Si (111) for further growth by pulsed CVD at 580° C.

The use of AlN deposited by ALA at 580° C. using a 10 s Ar plasma treatment at −10 V bias voltage as a template layer for further growth of AlN by pulsed CVD at 580° C. was examined. Results of this examination are shown in FIG. 29. Bulk-like density is retained in the sputtered material, indicating that the ALA layer acts as a template for epitaxial growth in the CVD material deposited at 580° C.

The foregoing is illustrative of the present invention and is not to be construed as limiting thereof. Further embodiments of the present inventive concept are exemplified in the following claims.

That which is claimed:

1. A method of forming a polycrystalline AlN film on a substrate comprising at least one cycle of:
   exposing a surface of the substrate to an organometallic chemical precursor comprising tris(dimethylamido) aluminum (TDMAA) or tris(diethylamido)aluminum (TDEAA);
   exposing the TDMAA or TDEAA precursor to a hydrazine ($N_2H_4$) co-reactant to provide an AlN layer on the substrate; and
   treating the AlN layer with an inert gas plasma to provide a polycrystalline AlN template layer on the substrate, wherein a DC bias voltage of about −25 V is applied during plasma treatment,
   the at least one cycle, or cycles, followed by:
   depositing a second polycrystalline AlN layer on the polycrystalline AlN template layer to provide the polycrystalline AlN film on the substrate,
   wherein the polycrystalline AlN template layer is treated with an inert gas plasma at a temperature of ≥350° C., wherein the carbon and/or oxygen (C/O) impurity concentration of the polycrystalline AlN template layer is less than 2 at %, and wherein the polycrystalline AlN template layer has a density of at least 3.0 g/cm$^3$.

2. The method of claim 1, wherein the second polycrystalline AlN layer is deposited on the polycrystalline AlN template layer by chemical vapor deposition (CVD), metalorganic chemical vapor deposition (MOCVD), or sputtering.

3. The method of claim 1, wherein the polycrystalline AlN template layer has a thickness of about 10 nm to about 25 nm.

4. The method of claim 1, wherein the second polycrystalline AlN layer has a thickness of about 100 nm to about 500 nm.

5. The method of claim 1, wherein the polycrystalline AlN film has a thermal conductivity of greater than or equal to about 70 Wm$^{-1}$K$^{-1}$.

6. The method of claim 1, wherein the polycrystalline AlN template layer is formed at a temperature less than or equal to about 400° C.

7. The method of claim 1, wherein the polycrystalline AlN template layer is formed at a temperature less than or equal to about 580° C.

8. The method of claim 1, wherein the inert gas plasma comprises an argon (Ar), neon (Ne), or krypton (Kr) plasma.

9. The method of claim 1, wherein the polycrystalline AlN film has a grain size of at least about 17 nm.

10. A method of forming a heat dissipating film on a substrate comprising at least one cycle of:
    exposing a surface of the substrate to a TDMAA precursor;
    exposing the TDMAA precursor to an $N_2H_4$ co-reactant to provide an AlN layer on the substrate; and
    treating the AlN layer with an Ar plasma to provide a polycrystalline AlN template layer on the substrate, wherein a DC bias voltage of about −25 V is applied during plasma treatment,
    the at least one cycle, or cycles, followed by:
    depositing a second polycrystalline AlN layer on the polycrystalline AlN template layer to provide the heat dissipating film on the substrate,
    wherein the polycrystalline AlN template layer is treated with an Ar plasma at a temperature of ≥350° C., wherein the carbon and/or oxygen (C/O) impurity concentration of the polycrystalline AlN template layer is less than 2 at %, and wherein the polycrystalline AlN template layer has a density of at least 3.0 g/cm$^3$.

11. The method of claim 10, wherein the second polycrystalline AlN layer is deposited on the polycrystalline AlN template layer by sputtering.

12. The method of claim 10, wherein the second polycrystalline AlN layer has a thickness of at least about 200 nm to about 300 nm.

13. The method of claim 10, wherein the heat dissipating film has a thermal conductivity of ≥about 70 Wm$^{-1}$K$^{-1}$.

14. The method of claim 10, wherein polycrystalline AlN template layer is formed at a temperature less than or equal to about 400° C.

15. The method of claim 10, wherein the heat dissipating film has a grain size of at least about 17 nm.

16. The method of claim 15, wherein the grain size is at least about 20 nm.

* * * * *